United States Patent
Lee

(10) Patent No.: US 9,559,192 B1
(45) Date of Patent: Jan. 31, 2017

(54) METHOD OF FABRICATING SEMICONDUCTOR DEVICE

(71) Applicant: Yong-Woo Lee, Anyang-Si (KR)

(72) Inventor: Yong-Woo Lee, Anyang-Si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 14/944,667

(22) Filed: Nov. 18, 2015

(51) Int. Cl.
*H01L 21/76* (2006.01)
*H01L 29/66* (2006.01)
*H01L 21/3065* (2006.01)
*H01L 21/308* (2006.01)
*H01L 21/762* (2006.01)
*H01L 21/02* (2006.01)

(52) U.S. Cl.
CPC ......... *H01L 29/6681* (2013.01); *H01L 21/308* (2013.01); *H01L 21/3065* (2013.01); *H01L 21/76224* (2013.01); *H01L 21/02565* (2013.01)

(58) Field of Classification Search
None
See application file for complete search history.

(56) References Cited

U.S. PATENT DOCUMENTS

| | | | |
|---|---|---|---|
| 6,689,650 B2 | 2/2004 | Gambino et al. | |
| 7,329,580 B2 | 2/2008 | Choi et al. | |
| 7,381,615 B2 | 6/2008 | Yuan | |
| 7,402,886 B2 | 7/2008 | Yuan | |
| 7,416,956 B2 | 8/2008 | Yuan | |
| 7,419,859 B2 | 9/2008 | Kim et al. | |
| 7,615,820 B2 | 11/2009 | Yuan | |
| 7,807,517 B2 | 10/2010 | Kim et al. | |
| 7,923,337 B2 | 4/2011 | Chang et al. | |
| 8,592,280 B2 | 11/2013 | Chang et al. | |
| 8,658,536 B1 | 2/2014 | Choi et al. | |
| 8,890,261 B2 | 11/2014 | Chang et al. | |
| 2008/0299734 A1 | 12/2008 | Lee et al. | |
| 2009/0294857 A1* | 12/2009 | Lee | H01L 27/10876 257/365 |
| 2011/0068431 A1 | 3/2011 | Knorr et al. | |
| 2013/0270641 A1* | 10/2013 | Chi | H01L 21/82382 257/351 |
| 2013/0277720 A1* | 10/2013 | Kim | H01L 29/785 257/288 |
| 2014/0001572 A1 | 1/2014 | Bohr et al. | |
| 2014/0027860 A1 | 1/2014 | Glass et al. | |
| 2015/0076653 A1 | 3/2015 | Hu et al. | |

(Continued)

FOREIGN PATENT DOCUMENTS

| | | |
|---|---|---|
| JP | 2008-300816 | 11/2008 |
| JP | 2010530623 | 9/2010 |

(Continued)

*Primary Examiner* — Angel Roman
(74) *Attorney, Agent, or Firm* — F. Chau & Associates, LLC

(57) ABSTRACT

A method of fabricating a semiconductor device includes forming a first fin-shaped pattern having a first fin mask pattern disposed thereon on a substrate, forming a second fin-shaped pattern having a second fin mask pattern disposed thereon on the substrate, forming a first trench by removing the first fin mask pattern, forming a fin-cut mask pattern filling the first trench, and removing the second fin mask pattern and the second fin-shaped pattern using the fin-cut mask pattern as a first etch mask.

20 Claims, 47 Drawing Sheets

(56) References Cited

U.S. PATENT DOCUMENTS

| | | | | |
|---|---|---|---|---|
| 2015/0091059 A1* | 4/2015 | Hung | ................ | H01L 29/66795 257/192 |
| 2015/0206759 A1* | 7/2015 | Tsao | ................... | H01L 29/0653 257/506 |
| 2015/0372139 A1* | 12/2015 | Wei | ..................... | H01L 29/7848 257/192 |

FOREIGN PATENT DOCUMENTS

| | | |
|---|---|---|
| KR | 100657969 | 12/2006 |
| KR | 1020080080281 | 9/2008 |
| WO | 2006057787 | 6/2006 |
| WO | 2007044896 | 4/2007 |
| WO | 2008155208 | 12/2008 |

\* cited by examiner

METHOD OF FABRICATING SEMICONDUCTOR DEVICE

TECHNICAL FIELD

Example embodiments of the inventive concept relate to a method of fabricating a semiconductor device.

DISCUSSION OF THE RELATED ART

Current scaling technologies may utilize a multi-gate transistor for increasing the integration of a semiconductor device. Referring to a multi-gate transistor, a fin-shaped multi-channel active pattern (e.g., a silicon body) is formed on a substrate and a gate is formed on the surface of the multi-channel active pattern.

Since a multi-gate transistor uses a three-dimensional channel, it is capable of being scaled. A multi-gate transistor can improve its current control capability without its gate length being increased. In addition, a short channel effect (SCE) in which the electrical potential of a channel region is influenced by a drain voltage can be effectively suppressed.

SUMMARY

According to example embodiments of the inventive concept, a method of fabricating a semiconductor device may include forming a first fin-shaped pattern having a first fin mask pattern disposed thereon on a substrate, forming a second fin-shaped pattern having a second fin mask pattern disposed thereon on the substrate, forming a first trench by removing the first fin mask pattern, forming a fin-cut mask pattern filling the first trench, and removing the second fin mask pattern and the second fin-shaped pattern using the fin-cut mask pattern as an etch mask.

In example embodiments of the inventive concept, forming the first fin-shaped pattern and the second fin-shaped pattern further may include forming a second trench defining the first fin-shaped pattern and the second fin-shaped pattern by removing a portion of the substrate.

In example embodiments of the inventive concept, the method may further include forming a first field insulating layer filling the second trench.

In example embodiments of the inventive concept, forming the first trench may include forming a recess by removing a portion of the first fin mask pattern, and expanding a width of the recess by removing a portion of the first field insulating layer.

In example embodiments of the inventive concept, forming the fin-cut mask pattern may include covering a top surface of the first fin-shaped pattern and a first portion of the first field insulating layer exposed by the first trench with the fin-cut mask pattern.

In example embodiments of the inventive concept, removing the second fin mask pattern and the second fin-shaped pattern may further include removing a second portion of the first field insulating layer.

In example embodiments of the inventive concept, removing the second portion of the first field insulating may include etching the second portion of the first field insulating layer to form a third trench having a slanted sidewall.

In example embodiments of the inventive concept, the method may further include removing the fin-cut mask pattern, forming a second field insulating layer on the first field insulating layer and the substrate to cover the first fin-shaped pattern, and removing a third portion of the first field insulating layer and a portion of the second field insulating layer, wherein the first fin-shaped pattern protrudes above the first and second field insulating layers upon removal of the third portion of the first field insulating layer and the portion of the second field insulating layer.

In example embodiments of the inventive concept, the method may further include removing the fin-cut mask pattern and the first field insulating layer, forming a second field insulating layer on the substrate to cover the first fin-shaped pattern, and removing a portion the second field insulating layer, wherein the first fin-shaped pattern protrudes above the second field insulating layer upon removal of the portion of the second field insulating layer.

In example embodiments of the inventive concept, removing the first fin mask pattern may include forming a mask layer on the second fin mask pattern, the mask layer exposing the first fin mask pattern, and removing the first fin mask pattern using the mask layer as a second etch mask.

In example embodiments of the inventive concept, the method further may include forming a stopper layer in the first trench and on the second fin mask pattern, forming the fin-cut mask pattern filling the first trench on the stopper layer in the first trench, and removing a portion of the stopper layer to expose a top surface of the second fin mask pattern.

In example embodiments of the inventive concept, the method may further include removing the fin-cut mask pattern to expose the stopper layer after removing the second fin mask pattern and the second fin-shaped pattern.

In example embodiments of the inventive concept, the method may further include forming a field insulating layer covering the first fin-shaped pattern and the stopper layer after removing the fin-cut mask pattern, and removing the stopper layer and a portion of the field insulating layer, wherein the first fin-shaped pattern protrudes above the field insulating layer upon removing the stopper layer and the portion of the field insulating layer.

In example embodiments of the inventive concept, removing the stopper layer and the portion of the field insulating layer may include planarizing the field insulating layer to expose the stopper layer, and removing the stopper layer and the portion of the field insulating layer after planarizing the field insulating layer.

According to example embodiments of the inventive concept, a method of fabricating a semiconductor device may include forming a fin-shaped structure including a first fin-shaped pattern, a second fin-shaped pattern, a first trench disposed between the first and second fin-shaped patterns, a first field insulating layer filling the first trench, a first fin mask pattern disposed on the first fin-shaped pattern, and a second fin mask pattern disposed on the second fin-shaped pattern. The method further includes forming a first mask pattern covering the second fin mask pattern and exposing the first fin mask pattern, forming a second trench exposing the first fin-shaped pattern by etching the fin-shaped structure using the first mask pattern as an etch mask, forming a second mask pattern filling the second trench, and forming a third trench by etching the second fin mask pattern and the second fin-shaped pattern using the second mask pattern as an etch mask.

In example embodiments of the inventive concept, a bottom surface of the third trench may be positioned at substantially a same level as or lower than a bottom surface of the first field insulating layer.

In example embodiments of the inventive concept, the method may further include removing the second mask pattern and forming a second field insulating layer filling the third trench.

In example embodiments of the inventive concept, the method may further include etching the first field insulating layer and the second field insulating layer to expose a portion of a sidewall and a top surface of the first fin-shaped pattern.

According to example embodiments of the inventive concept, a method of manufacturing a semiconductor device may include forming a first fin mask pattern and a second fin mask pattern spaced apart from each other on a substrate, and forming a first fin-shaped pattern and a second fin-shaped pattern by etching the substrate using the first fin mask pattern and the second fin mask pattern as a first etch mask. The first fin mask pattern may be disposed on the first fin-shaped pattern and the second fin mask pattern may be disposed on the second fin-shaped pattern. The method further may include forming a field insulating layer between the first and second fin-shaped patterns and between the first and second fin mask patterns, forming a mask layer on the second fin mask pattern to expose the first fin mask pattern, forming a recess by removing the first fin mask pattern, forming a trench by expanding a width of the recess, wherein the width of the recess is expanded by removing a first portion of the field insulating layer, forming a fin-cut mask pattern filling the trench, removing a second portion of the field insulating layer, the second fin mask pattern and the second fin-shaped pattern using the fin-cut mask pattern as a second etch mask, removing the fin-cut mask pattern to expose the first fin-shaped pattern, forming an insulating layer covering the first fin-shaped pattern and the field insulating layer, and removing a third portion of the field insulating layer and a portion of the insulating layer. The first fin-shaped pattern may protrude above the field insulating layer and the insulating layer upon removing the third portion of the field insulating layer and the portion of the insulating layer.

According to example embodiments of the inventive concept, a method of manufacturing a semiconductor device may include forming a real fin-shaped pattern and a dummy fin-shaped pattern on a substrate by forming a first trench between the real fin-shaped pattern and the dummy fin-shaped pattern. The first trench may be formed by removing a portion of the substrate. The method may further include forming a first fin mask pattern on the real fin-shaped pattern and a second fin mask pattern on the dummy fin-shaped pattern, forming a first field insulating layer filling the first trench, and forming a mask layer on the second fin mask pattern. The mask layer may not be formed on the first fin mask pattern. The method further may include forming a second trench in the first field insulating layer. The second trench may expose a portion of an upper sidewall of the first field insulating layer and a top surface of the real fin-shaped pattern. The method may further include forming a third trench by expanding a width of the second trench using the mask layer as a first etch mask. A bottom surface of the third trench may be substantially coplanar with a top surface of the dummy fin-shaped pattern. The method may further includes removing the mask layer after forming the third trench, forming a fin-cut mask pattern filling the third trench, and removing the second fin mask pattern and the dummy fin-shaped pattern using the fin-cut mask pattern as a second etch mask.

BRIEF DESCRIPTION OF THE DRAWINGS

The above and other aspects and features of the inventive concept will become more apparent by describing in detail example embodiments thereof with reference to the accompanying drawings, in which.

DETAILED DESCRIPTION OF THE EXAMPLE EMBODIMENTS

Figure 1:
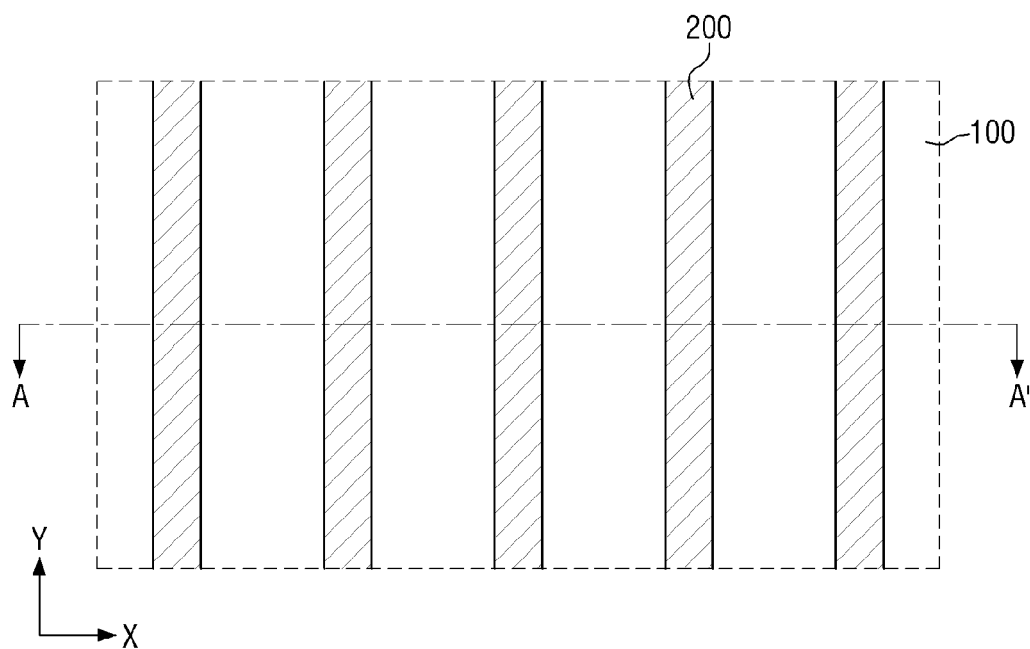
FIGS. 1 to 14 describe a method of fabricating a semiconductor device according to example embodiments of the inventive concept.

Example embodiments of the inventive concept will be described more fully hereinafter with reference to the accompanying drawings. In the drawings, the size and relative sizes of layers and regions may be exaggerated for clarity. Like reference numerals may refer to like elements throughout the accompanying drawings.

In the drawings, the thicknesses of layers and regions may be exaggerated for clarity.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments.

It will be understood that, if an element is referred to as being "connected" or "coupled" to another element, it can be directly connected or coupled to the other element, or intervening elements may be present. Other words used to describe the relationship between elements should be interpreted in a like fashion (e.g., "between," "adjacent," etc.).

As used herein, the singular forms "a," "an" and "the" are intended to include the plural forms as well, unless the context clearly indicates otherwise.

Spatially relative terms (e.g., "beneath," "below," "lower," "above," "upper," etc.) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (e.g., rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing.

It should also be noted that in some example embodiments, the functions/acts noted may occur out of the order noted in the figures. For example, two figures shown in succession may in fact be executed substantially concurrently or may sometimes be executed in the reverse order, depending upon the functionality/acts involved.

Devices and methods of forming devices according to various example embodiments described herein may be embodied in microelectronic devices such as integrated circuits, in which a plurality of devices according to various example embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various example embodiments described herein may include a plurality of the devices in an array and/or in a two-dimensional pattern that is based on the functionality of the microelectronic device.

The devices according to various example embodiments described herein may be interspersed among other devices depending on the functionality of the microelectronic device. Moreover, microelectronic devices according to various example embodiments described herein may be replicated in a third direction that may be orthogonal to the two different directions, to provide three-dimensional integrated circuits.

Accordingly, the cross-sectional view(s) illustrated herein provide support for a plurality of devices according to various example embodiments described herein that extend along two different directions in a plan view and/or in three different directions in a perspective view. The two different directions may or may not be orthogonal to each other. The three different directions may include a third direction that may be orthogonal to the two different directions. The plurality of device structures may be integrated in the same electronic device. For example, when a single active region is illustrated in a cross-sectional view of a device/structure, the device/structure may include a plurality of active regions and transistor structures thereon, as would be illustrated by a plan view of the device/structure. The plurality of device structures may be arranged in an array and/or in a two-dimensional pattern.

Herein, when two or more elements or values are described as being substantially the same as or about equal to each other, it is to be understood that the elements or values are identical to each other, indistinguishable from each other, or distinguishable from each other but functionally the same as each other as would be understood by a person having ordinary skill in the art.

Hereinafter, a method of fabricating a semiconductor device according to example embodiments of the inventive concept will be described with reference to FIGS. 1 to 14.

FIGS. 1 to 14 are views illustrating a method of fabricating a semiconductor device according to example embodiments of the inventive concept. More particularly, FIG. 1 is a layout diagram illustrating a method of fabricating a semiconductor device according to example embodiments of the inventive concept, and FIGS. 2 to 14 are cross-sectional views taken along line A-A' of FIG. 1.

Figure 2:
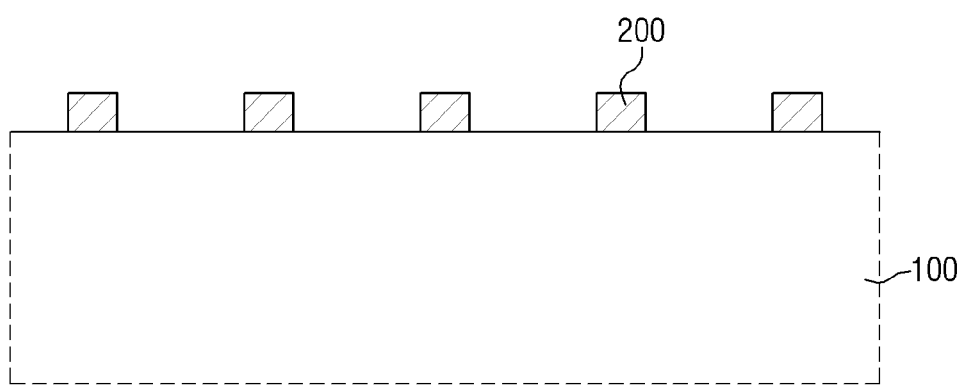

Referring to FIGS. 1 and 2, a method of fabricating a semiconductor device according to example embodiments of the inventive concept may include forming a fin mask pattern 200 on a substrate 100.

The substrate 100 may be, for example, a bulk silicon substrate, or a silicon-on-insulator (SOI) substrate. Alternatively, the substrate 100 may include, for example, germanium as a semiconductor element or a semiconductor compound material (e.g., IV-IV group semiconductor compound or III-V group semiconductor compound). However, the substrate 100 is not limited thereto.

The IV-IV group semiconductor compound may include, for example, a binary compound, a ternary compound, a binary compound doped with a group IV element, or a ternary compound doped with a group IV element, each of which contains at least two of carbon (C), silicon (Si), germanium (Ge), and tin (Sn). However, the IV-IV group semiconductor compound is not limited thereto.

The III-V group semiconductor compound may include, for example, a binary compound, a ternary compound, or a quaternary compound, each of which is formed by the combination of at least one group III element such as aluminum (Al), gallium (Ga) and indium (In) and at least one group V element such as phosphorus (P), arsenic (As) and antimony (Sb). However, the III-V group semiconductor compound is not limited thereto.

Further, the substrate 100 may include a base substrate and an epitaxial layer formed thereon.

The fin mask pattern 200 may be formed on the substrate 100. The fin mask pattern 200 may be formed to extend in a second direction Y. The fin mask pattern 200 may be formed in a plurality. That is, a plurality of fin mask patterns 200 may be disposed on the substrate 100. The fin mask patterns 200 may be spaced apart from each other in a first direction X and may be substantially parallel to one another. The first direction X and the second direction Y are substantially perpendicular with respect to each other.

Each of the fin mask patterns 200 may have a fixed width in the first direction X. For example, the fin mask patterns 200 may have a same width in the first direction X. In example embodiments, a width of a fin-shaped pattern F (see FIG. 3) can be determined by the fin mask patterns 200. Thus, the fin-shaped pattern F may have a fixed width in the first direction X. Herein, the fin-shaped pattern F may be described as including a plurality of fin-shaped patterns F including, for example, a first fin-shaped pattern F having a first fin mask pattern 210 disposed thereon, and a second fin-shaped pattern F having a second fin mask pattern 220 disposed thereon. The fin mask patterns 200 may be disposed with a regular interval therebetween. Thus, the fin-shaped patterns F may be disposed at regular intervals. However, example embodiments according to the inventive concept are not limited thereto. For example, in example embodiments, the widths of the fin mask patterns 200 may be different from each other in the first direction X and/or the intervals between the fin mask patterns 200 may be different from one another in the first direction X. Therefore, widths of the fin-shaped patterns F and intervals between the fin-shaped patterns F may be different from one another, respectively.

The fin mask pattern 200 may include a material having an etch selectivity with respect to the substrate 100. For example, the fin mask pattern 200 may include silicon nitride. The fin mask pattern 200 may be constituted of multiple layers. For example, each of the multiple layers of the fin mask pattern 200 may include at least one of silicon oxide, silicon oxynitride, silicon nitride, a silicon-containing material such as polysilicon, a carbon-containing material such as ACL (amorphous carbon layer) or SOH (Spin-On Hardmask), and metal. However, example embodiments are not limited thereto. In an example embodiment, the fin mask pattern 200 may include a lower layer including silicon nitride, an intermediate layer including silicon oxide, and an upper layer including polysilicon, which are sequentially stacked. The fin mask pattern 200 may further include a thin layer including silicon oxide under the lower layer. However, the fin mask pattern 200 is not limited thereto.

Figure 3:
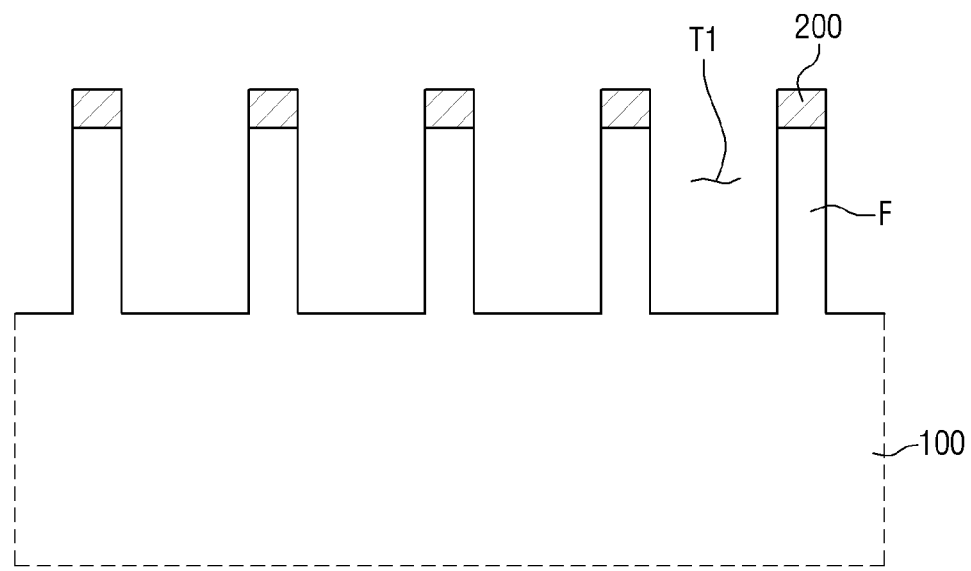

Referring to FIG. 3, the fin-shaped pattern F and a first trench T1 may be formed.

The fin-shaped pattern F may protrude from the substrate 100. The fin-shaped pattern F may be formed by etching the substrate 100 using the fin mask pattern 200 as an etch mask. Thus, the fin-shaped pattern F may have a shape similar to that of the fin mask pattern 200, and the fin-shaped pattern F may be formed in a plurality. The plurality of fin-shaped patterns F may extend in the second direction Y and may be separated from one another in the first direction X.

In example embodiments according to the inventive concept, the fin-shaped pattern F includes a silicon fin-shaped active pattern containing silicon. However, the fin-shaped pattern F is not limited thereto.

Although the fin-shaped pattern F is shown as having a rectangular shape in FIG. 3, example embodiments of the inventive concept are not limited thereto. In a case in which the fin-shaped pattern F has the rectangular shape, the fin-shaped pattern F may have a long side and a short side, as shown in FIG. 3.

Each fin-shaped pattern F may include a first side surface and a second side surface opposite to the first side surface in the first direction X. The first and second side surfaces of each fin-shaped pattern F extend from the substrate 100 and are connected to one another by a top surface. The first and second side surfaces of the fin-shaped pattern F may be exposed by the first trench T1. The fin-shaped pattern F may be defined by the first trench T1.

Figure 4:
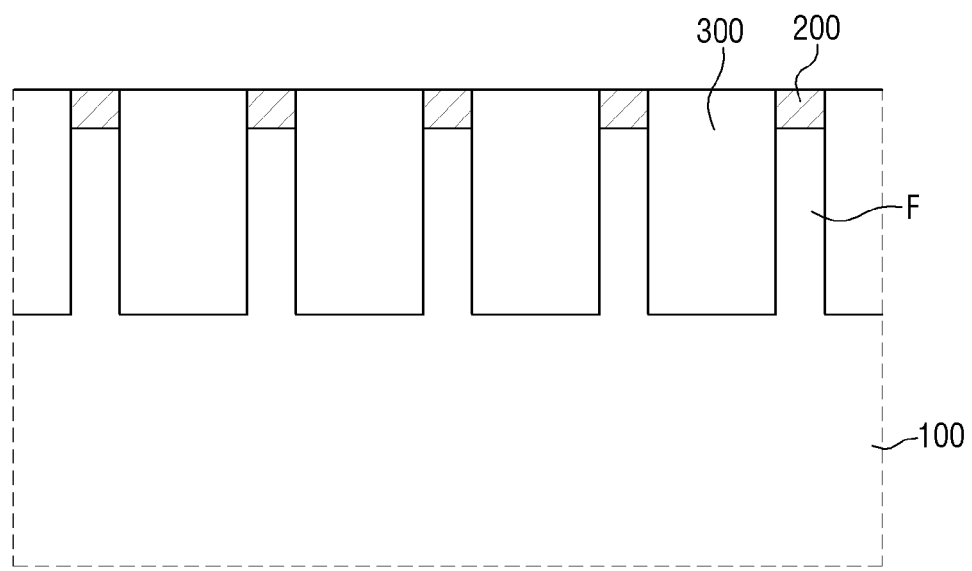

Referring to FIG. 4, a first field insulating layer 300 may be formed to fill the first trench T1.

The first field insulating layer 300 may be formed on the substrate 100 and may be disposed around the fin-shaped pattern F. For example, the first field insulating layer 300 may be formed to partially surround the fin-shaped pattern F and the fin mask pattern 200. For example, the first field insulating layer 300 may be formed to surround the side surfaces of the fin-shaped pattern F and the fin mask pattern 200, as shown in FIG. 4. The first field insulating layer 300 may include, for example, silicon oxide, silicon nitride, silicon oxynitrde and/or a low-k dielectric material having a permittivity lower than that of silicon oxide. The low-k dielectric material for the first field insulating layer 300 may be, for example, FOX (Flowable Oxide), TOSZ (Torene SilaZene), USG (Undoped Silica Glass), BSG (Borosilica Glass), PSG (PhosphoSilica Glass), BPSG (BoroPhospho-Silica Glass), PETEOS (Plasma Enhanced Tetra Ethyl Ortho Silicate), FSG (Fluoride Silicate Glass), CDO (Carbon Doped silicon Oxide), Xerogel, Aerogel, Amorphous Fluorinated Carbon, OSG (Organo Silicate Glass), Parylene, BCB (bis-benzocyclobutenes), SiLK, polyimide, porous polymeric material, or a combination thereof. However, the low-k dielectric material is not limited thereto.

In example embodiments, a top surface of the first field insulating layer 300 may be substantially coplanar with a top surface of the fin mask pattern 200 (e.g., the top surface of the first field insulating layer 300 and the top surface of the fin mask pattern 200 may be substantially aligned with one another in a horizontal direction). For example, the first field insulating layer 300 may fill the first trench T1 to cover the fin mask pattern 200, and may be planarized to expose the top surface of the fin mask pattern 200. The first field insulating layer 300 may be in contact with the fin mask pattern 200 and the fin-shaped pattern F.

Figure 5:
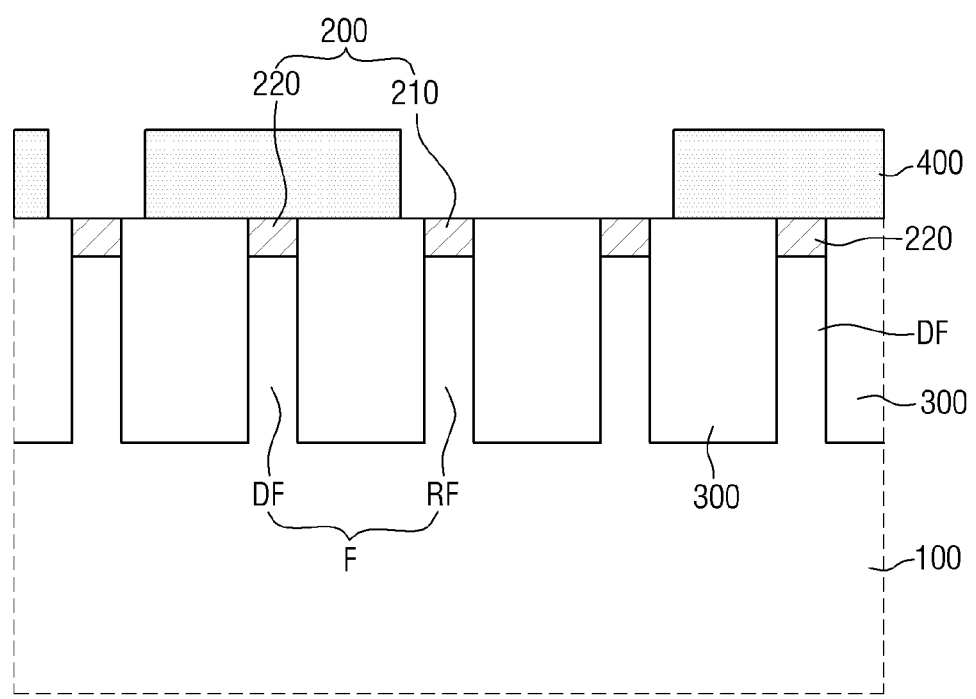

Referring to FIG. 5, the fin mask pattern 200 may include a first fin mask pattern 210 and a second fin mask pattern 220, which are laterally adjacent to each other. At least two first fin mask patterns 210 may be disposed between the second fin mask patterns 220. A mask layer 400 may be formed on the second fin mask pattern 220. The mask layer 400 may also be referred to herein as a mask pattern 400. According to example embodiments, the mask layer 400 is not formed on the first fin mask pattern 210. That is, a top surface of the first fin mask pattern 210 may be exposed. The mask layer 400 may overlap a portion of the first field insulating layer 300 in a vertical direction.

The fin-shaped pattern F may include a dummy fin-shaped pattern DF and a real fin-shaped pattern RF. The dummy fin-shaped pattern DF may be disposed under the second fin mask pattern 220, and the real fin-shaped pattern RF may be disposed under the first fin mask pattern 210. In example embodiments, the dummy fin-shaped pattern DF overlaps the mask layer 400 in a vertical direction and the real fin-shaped pattern RF does not overlap the mask layer 400 in a vertical direction.

The mask layer 400 may include, for example, photoresist, ACL (amorphous carbon layer) and/or SOH (Spin-On Hardmask). The mask layer 400 may include a material having an etch selectivity with respect to the first fin mask pattern 210. In example embodiments, the mask layer 400 may be patterned by a photolithography process. In example embodiments, the mask layer 400 may be patterned by an etch process.

Figure 6:
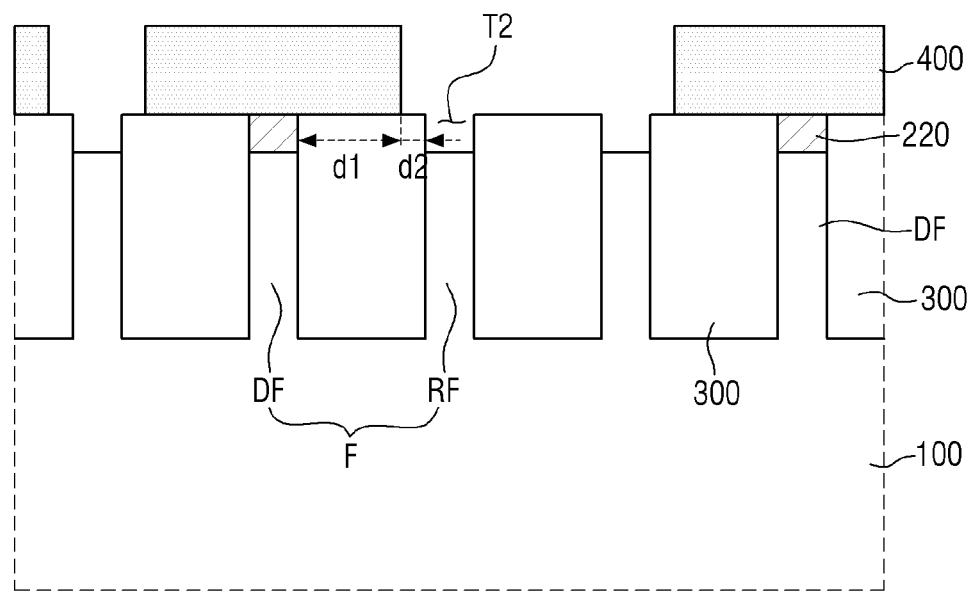

Referring to FIG. 6, the first fin mask pattern 210 may be removed. For example, the first fin mask pattern 210 may be removed by a wet etch process or a dry etch process. The second fin mask pattern 220 is not removed due to the second fin mask pattern 220 being covered with the mask layer 400. That is, the mask layer 400 may be used as an etch mask for selectively removing the first fin mask pattern 210.

In accordance with the removal of the first fin mask pattern 210, a top surface of the real fin-shaped pattern RF may be exposed. Further, a second trench T2 may be formed in the first field insulating layer 300. The second trench T2 may be defined by the first field insulating layer 300 and the real fin-shaped pattern RF. That is, the second trench T2 may expose a portion of an upper sidewall of the first field insulating layer 300 and the top surface of the real fin-shaped pattern RF.

The top surface of the first field insulating layer 300 may include a first portion d1 which vertically overlaps the mask layer 400 and a second portion d2 which does not vertically overlap the mask layer 400.

Figure 7:
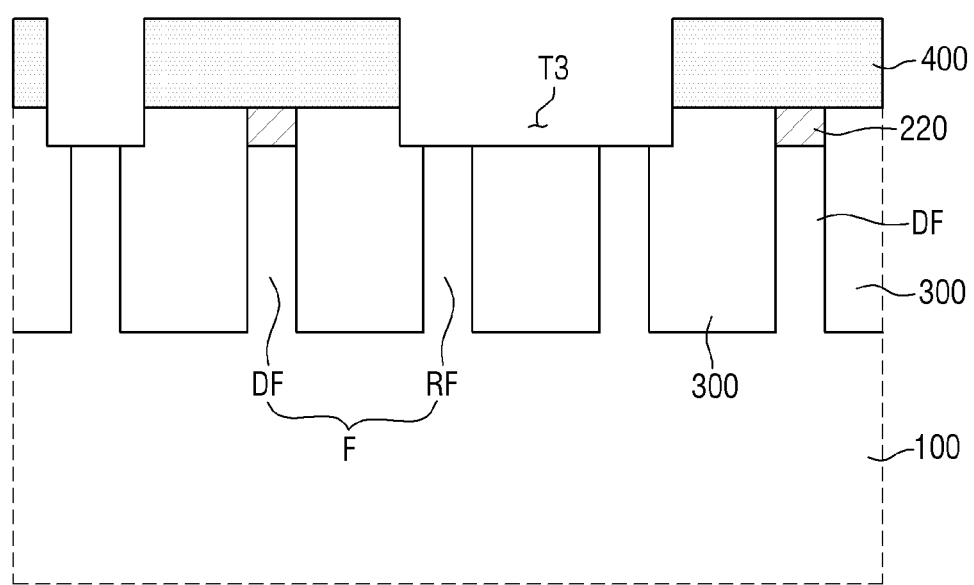

Referring to FIG. 7, a third trench T3 may be formed according to an example embodiment of the inventive concept.

The third trench T3 may be formed by expanding a width of the second trench T2. The portion of the first field insulating layer 300 which is not overlapped with the mask layer 400 may be removed using the mask layer 400 as an etch mask, thereby forming the third trench T3. That is, an upper portion of the first field insulating layer 300 which is exposed by the second trench T2 may be removed so as to expand the width of the second trench T2 in the first direction X. Thus, the expanded second trenches T2 may be connected to each other such that the third trench T3 is formed.

A bottom surface of the third trench T3 may be substantially coplanar with a top surface of the dummy fin-shaped pattern DF (e.g., the bottom surface of the third trench T3 and the top surface of the dummy fin-shaped pattern DF may be substantially aligned with one another in a horizontal direction). That is, the third trench T3 may be formed by removing the first field insulating layer 300 by a depth of the second trench T2.

Figure 8:
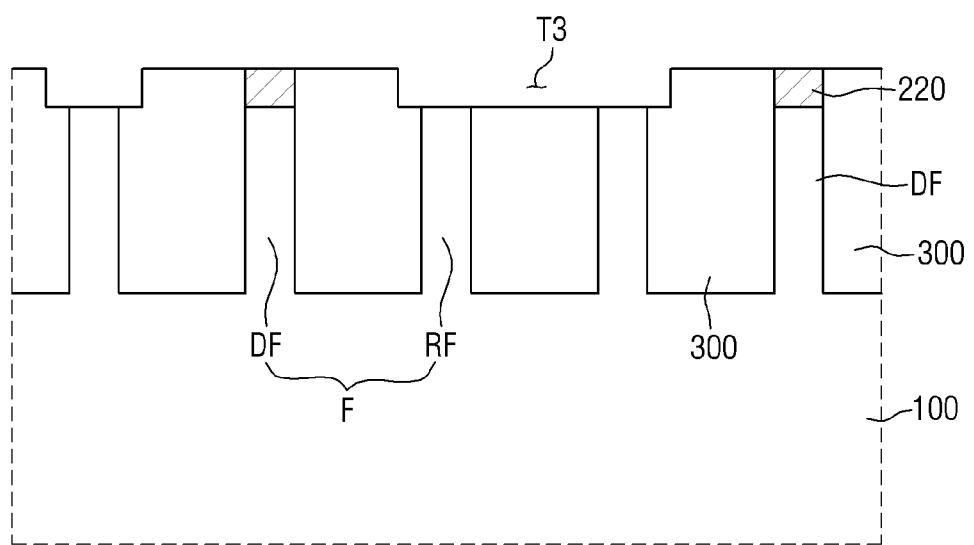

Referring to FIG. 8, the mask layer 400 may be removed. Thus, a top surface of the second fin mask pattern 220 may be exposed. Further, a top surface of the first field insulating layer 300 may be exposed. For example, entire top surfaces of the second fin mask pattern 220 and the first field insulating layer 300 may be exposed.

The mask layer 400 may be removed by, for example, a dry etch process or a wet etch process. However, example embodiments of the inventive concept are not limited thereto.

Referring to FIGS. 6 to 8, the third trench T3 may be formed by enlarging the second trench T2 using the mask layer 400 as an etch mask, and then removing the mask layer 400. However, example embodiments of the inventive concept are not limited thereto. For example, in example embodiments, the mask layer 400 may be removed first, and then the third trench T3 may be formed by enlarging the second trench T2. Here, the second trench T2 may be enlarged by removing the first field insulating layer 300 using, for example, a wet etch process. For example, a wet etch process using HF may be performed to remove the field insulating layer 300.

Figure 9:
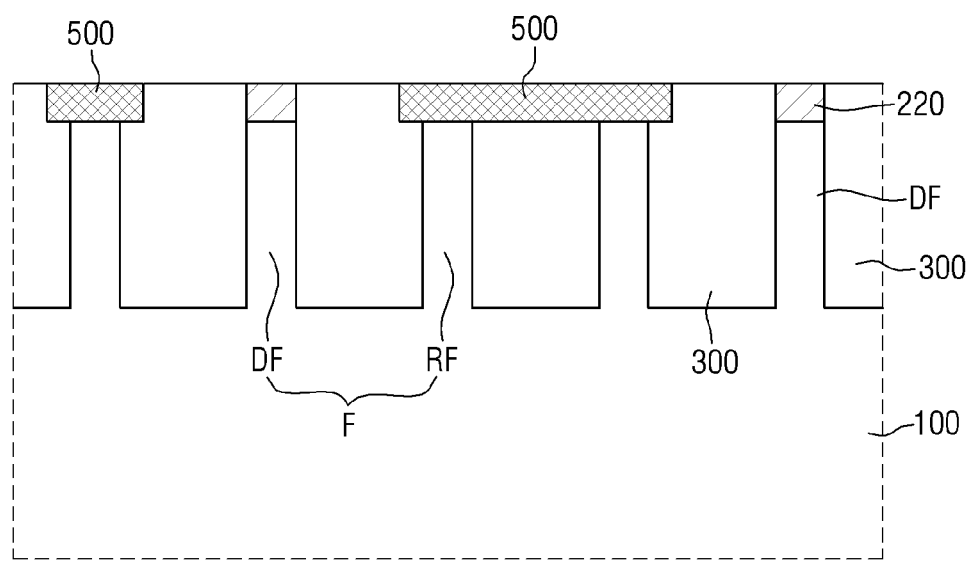

Referring to FIG. 9, a fin-cut mask pattern 500 may be formed according to an example embodiment of the inventive concept.

The fin-cut mask pattern 500 may fill the third trench T3. The fin-cut mask pattern 500 may cover the real fin-shaped pattern RF and the first field insulating layer 300, which are exposed by the third trench T3.

The fin-cut mask pattern 500 may be formed of or include, for example, a carbon-containing inorganic material, or an organic material such as, for example, photoresist and/or oxide.

The fin-cut mask pattern 500 may be substantially coplanar with the top surfaces of the second fin mask pattern 220 and the first field insulating layer 300 (e.g., a top surface of the fin-cut mask pattern 500 and the top surfaces of the second fin mask pattern 220 and the first field insulating layer 300 may be substantially aligned with one another in a horizontal direction). The top surfaces of the fin-cut mask pattern 500, the second fin mask pattern 220 and the first field insulating layer 300 may be substantially coplanar with each other as the result of a planarization process.

Figure 10A:
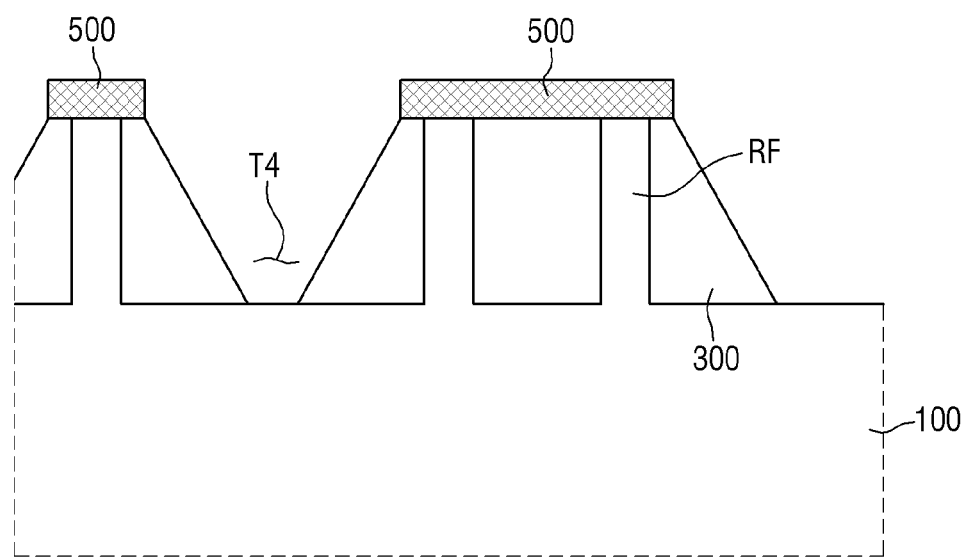

Referring to FIG. 10A, a fourth trench T4 may be formed according to an example embodiment of the inventive concept.

The fourth trench T4 may be formed by etching the first field insulating layer 300 and the dummy fin-shaped pattern DF. In example embodiments, a bottom surface of the fourth trench T4 may be positioned at substantially the same level as that of the first field insulating layer 300. In example embodiments, the bottom surface of the first trench T4 may be positioned at a lower or higher level than that of the first field insulating layer 300. A sidewall of the fourth trench T4 may be inclined. That is, the first field insulating layer 300 may be etched to have a slanted profile. The fourth trench T4 may have a width decreasing in a downward direction from the fin-cut mask pattern 500 toward the substrate 100. This may be caused by a property of the etch process for forming the fourth trench T4. The substrate 100 may be exposed by the fourth trench T4.

Figure 10B:
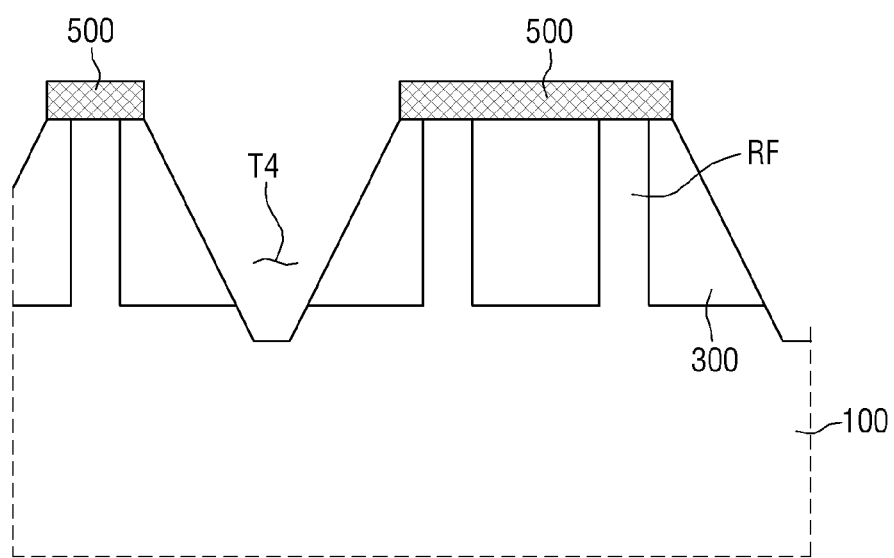

In example embodiments, when the fourth trench T4 is formed, the substrate 100 may be etched, as shown in FIG. 10B. As a result, the bottom surface of the fourth trench T4 may be lower than that of the first field insulating layer 300. That is, the bottom surface of the fourth trench T4 may be lower than that of the first trench T1 shown in FIG. 3. However, example embodiments of the inventive concept are not limited thereto.

In a method of fabricating the semiconductor device according to example embodiments of the inventive concept, a position of the fin-cut mask pattern 500 may be precisely defined. Therefore, the fourth trench T4 may be formed in the first field insulating layer 300. As a result, since a portion of the dummy fin-shaped pattern DF may be prevented from being left to form a sharp spike-shaped pattern during the etch process for forming the fourth trench T4, reliability and performance of the semiconductor device may be improved.

In example embodiments, the real fin-shaped pattern RF is not removed by the fin-cut mask pattern 500. According to the removal of the dummy fin-shaped pattern DF, the interval between the real fin-shaped patterns RF may be controlled for fabricating the semiconductor device. The real fin-shaped pattern RF may be used as a transistor channel region.

Figure 11:
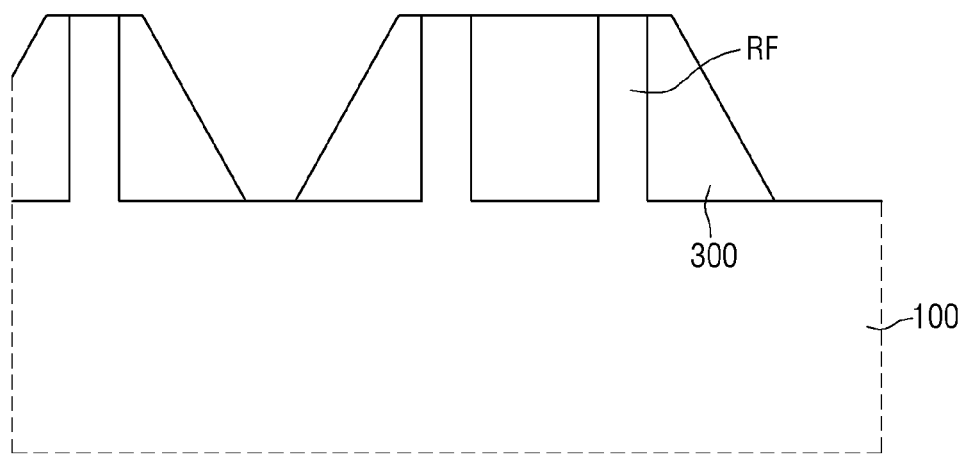

Referring to FIG. 11, the fin-cut mask pattern 500 may be removed according to an example embodiment of the inventive concept.

Therefore, the top surface of the real fin-shaped pattern RF may be exposed. Further, the top surface of the first field insulating layer 300 may be exposed.

Here, the top surface of the first field insulating layer 300 may be substantially coplanar with that of the real fin-shaped pattern RF.

Figure 12:
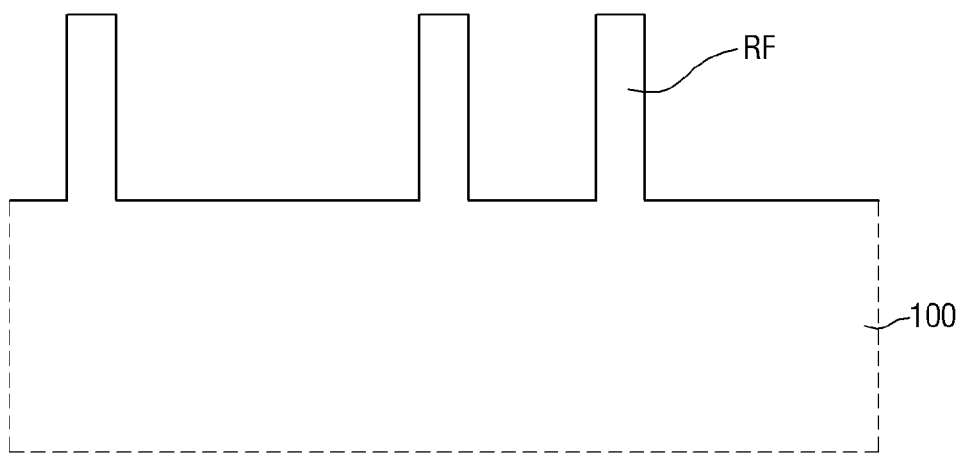

Referring to FIG. 12, the first field insulating layer 300 may be removed.

Therefore, a side surface of the real fin-shaped pattern RF may be exposed. The first field insulating layer 300 may be removed using, for example, a wet etch process or a dry etch process. However, example embodiments of the inventive concept are not limited thereto.

The top surface of the substrate 100 covered by the first field insulating layer 300 may be exposed by the removal of the first field insulating layer 300.

The interval between the real fin-shaped patterns RP may be controlled by removing one or more dummy fin-shaped patterns DF between the real fin-shaped patterns RF.

Figure 13:
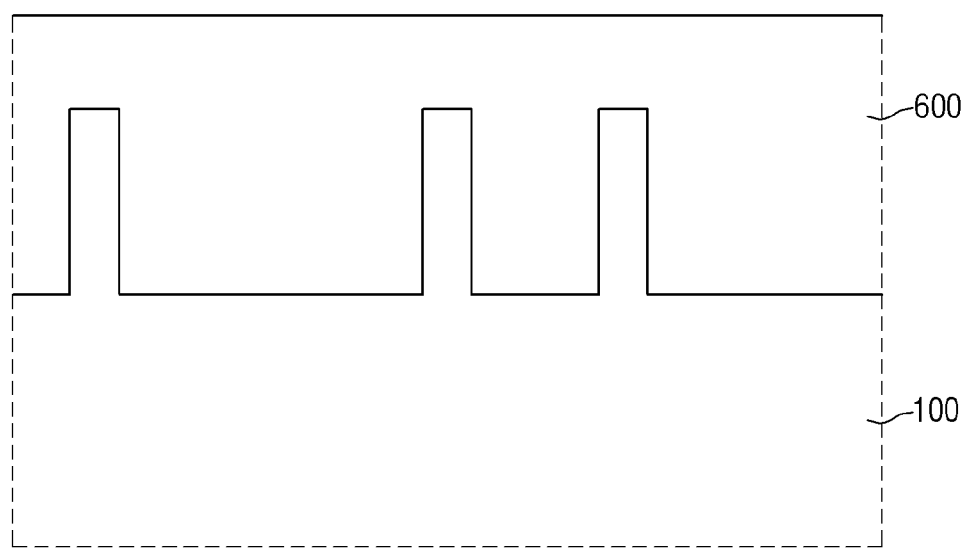

Referring to FIG. 13, a second field insulating layer 600 may be formed.

The second field insulating layer 600 may be formed to cover the substrate 100 and the real fin-shaped pattern RF. For example, the second field insulating layer 600 may cover the top surface of the substrate 100, and the top and side surfaces of the real fin-shaped pattern RF. Thus, the top surface of the second field insulating layer 600 may be higher than that of the real fin-shaped pattern RF.

Here, the second field insulating layer 600 may include, for example, an oxide layer (e.g., silicon oxide layer), a nitride layer (e.g., silicon nitride layer), an oxynitride layer (e.g., silicon oxynitride layer), a low-k dielectric layer having a lower dielectric constant than silicon oxide, or a combination thereof. The second field insulating layer 600 may include the same material as that of the first field insulating layer 300. However, example embodiments of the inventive concept are not limited thereto.

Figure 14:
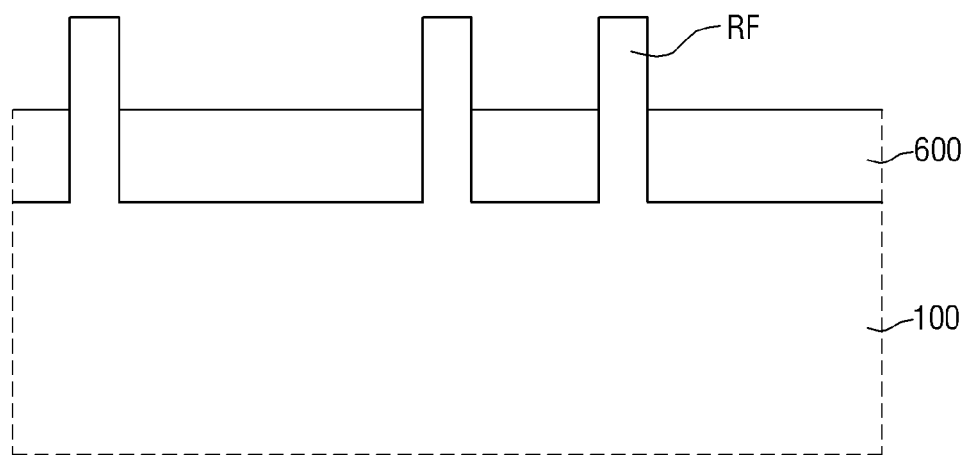

Referring to FIG. 14, the real fin-shaped pattern RF may protrude above the second field insulating layer 600.

The real fin-shaped pattern RF may be protruded by removing a portion of the second field insulating layer 600. That is, the real fin-shaped pattern RF may protrude above a top surface of the second field insulating layer 600 upon the removal of a portion of the second field insulating layer 600. In example embodiments, a side surface of the lower portion of the real fin-shaped pattern RF may be covered with the second field insulating layer 600, and a side surface of an upper portion of the real fin-shaped pattern RF and a top surface of the real-fin shaped pattern RF may be exposed.

A gate electrode may be formed on the real fin-shaped pattern RF and the second field insulating layer 600. The gate electrode may extend in the first direction X shown in FIG. 1. The gate electrode may be formed to cover the top and side surfaces of the upper portion of the real fin-shaped pattern RF.

Source/drains may be formed at opposite sides of the gate electrode. The source/drains may be formed on or in the real fin-shaped pattern RF. The source/drains may each include an epitaxial layer which is formed by an epitaxial growth process. The source/drains may be, for example, elevated source/drains. An outer surface of the epitaxial layer may have various shapes. For example, the outer surface of the epitaxial layer may have a diamond shape, a circular shape and a rectangular shape, however example embodiments of the inventive concept are not limited thereto.

In a case in which a semiconductor device including the gate electrode and source/drains is a p-type metal-oxide-semiconductor (PMOS) transistor, the epitaxial layer may include a compressive stress material. The compressive stress material may include, for example, a material having a lattice constant higher than that of silicon. The compressive stress material may be, for example, silicon germanium (SiGe), however example embodiments of the inventive concept are not limited thereto. The compressive stress material may apply a compressive stress to the real fin-shaped pattern RF such that the carrier mobility in the channel region of the PMOS transistor is improved.

When a semiconductor device including the gate electrode and source/drains is an n-type metal-oxide-semiconductor (NMOS) transistor, the epitaxial layer may include a tensile stress material. When the real fin-shaped pattern RF is formed of silicon, the tensile stress material may include a material having a lattice constant lower than that of silicon. The tensile stress material may be, for example, silicon carbide (SiC), however example embodiments of the inventive concept are not limited thereto. The tensile stress material may apply a tensile stress to the real fin-shaped pattern RF such that the carrier mobility in the channel region of the NMOS transistor is improved.

Hereinafter, a method of fabricating a semiconductor device according to example embodiments of the inventive concept will be described with reference to FIGS. 1 to 11, 15 and 16.

Figure 15:
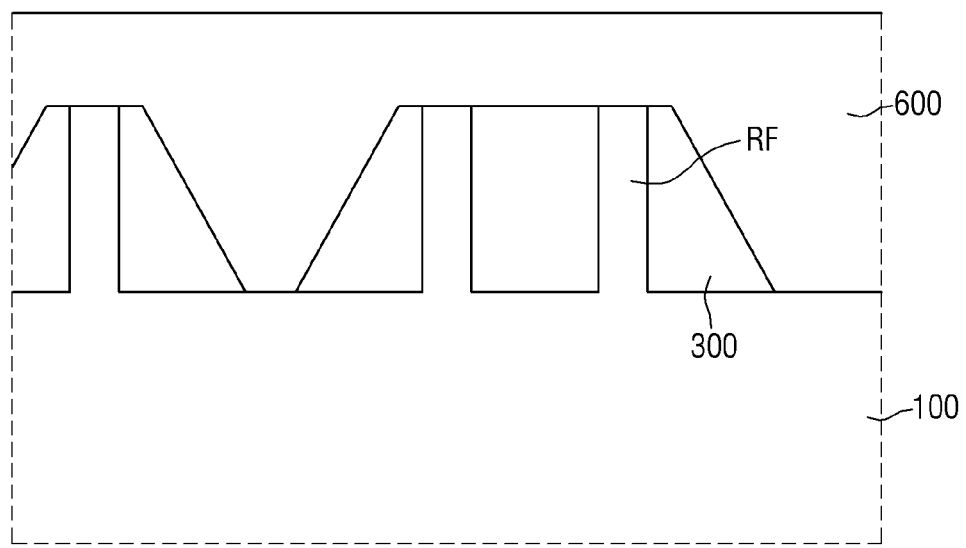
FIGS. 15 and 16 describe a method of fabricating a semiconductor device according to example embodiments of the inventive concept.

Referring to FIG. 15, a second field insulating layer 600 may be disposed on the first field insulating layer 300 and the real fin-shaped pattern RF.

The second field insulating layer 600 may fill the fourth trench T4 and cover the top surface of the first field insulating layer 300 and the top surface of the real fin-shaped pattern RF. The top surface of the second field insulating layer 600 may be positioned at a higher level than that of the first field insulating layer 300 and the real fin-shaped pattern RF.

The second field insulating layer 600 may include, for example, an oxide layer (e.g., silicon oxide layer), a nitride layer (e.g., silicon nitride layer), an oxynitride layer (e.g., silicon oxynitride layer), a low-k dielectric layer having a lower dielectric constant than silicon oxide, or a combination thereof. The second field insulating layer 600 may include a same material as that of the first field insulating layer 300. However, example embodiments of the inventive concept are not limited thereto.

Figure 16:
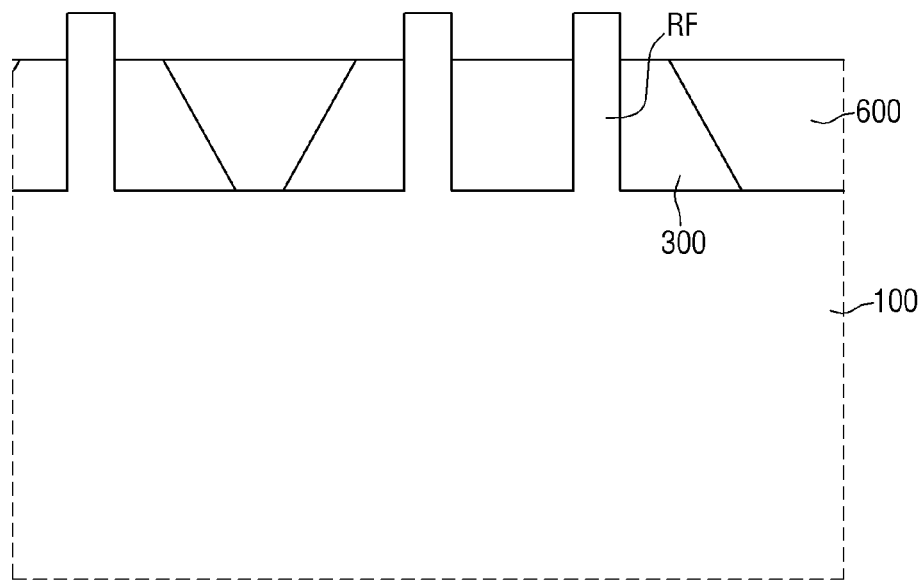

Referring to FIG. 16, the real fin-shaped pattern RF may be protruded by etching the first and second field insulating layers 300 and 600. The real fin-shaped pattern RF may protrude above top surfaces of the first and second field insulating layers 300 and 600. A side surface of the lower portion of the real fin-shaped pattern RF may be covered by the first field insulating layer 300, and a side surface of an upper portion of the real fin-shaped pattern RF and the top surface of the real fin-shaped pattern RF may be exposed.

When the first and second field insulating layers 300 and 600 are formed of the same material, the first and second field insulating layers 300 and 600 may be removed by the same etch process so as to expose the upper portion of the real fin-shaped pattern RF.

Hereinafter, a method of fabricating a semiconductor device according to example embodiments of the inventive concept will be described with reference to FIGS. 1 to 8 and 17 to 23. For convenience of explanation, further description of FIGS. 1 to 8 may be omitted herein.

Figure 17:
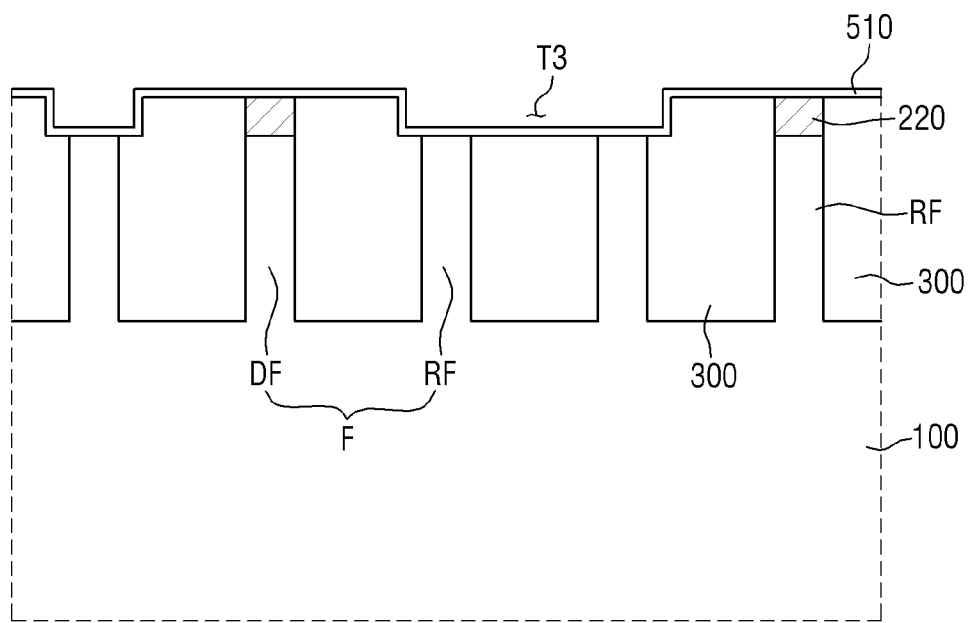
FIGS. 17 to 23 describe a method of fabricating a semiconductor device according to example embodiments of the inventive concept.

Referring to FIG. 17, a stopper layer 510 may be formed.

The stopper layer 510 may be formed on the first field insulating layer 300, the second fin mask pattern 220 and the real fin-shaped pattern RF. The stopper layer 510 may be conformally formed on top surfaces of the first field insulating layer 300, the second fin mask pattern 220 and the real fin-shaped pattern RF. The stopper layer 510 may be conformally formed along inner surfaces of the third trench T3. Thus, in example embodiments, the stopper layer 510 may be formed along and contact every exposed surface that the stopper layer 510 is formed upon.

The stopper layer 510 may include, for example, silicon nitride. However, example embodiments of the inventive concept are not limited thereto. The stopper layer 510 may serve as a stopper during a planarization process.

Figure 18:
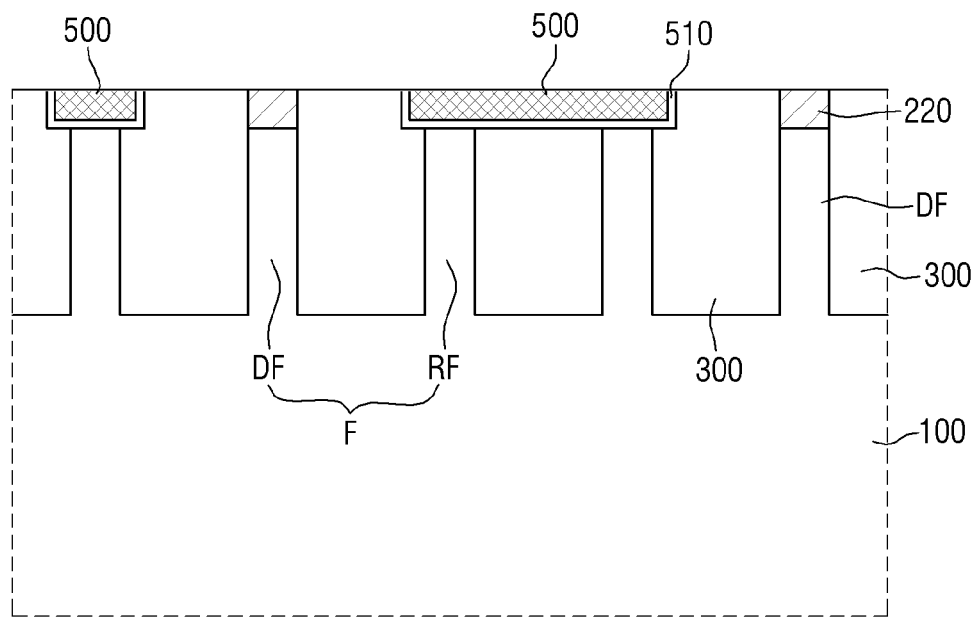

Referring to FIG. 18, a fin-cut mask pattern 500 may be formed.

The fin-cut mask pattern 500 may be formed on the stopper layer 510 and may fill the third trench T3.

The formation of the fin-cut mask pattern 500 may include forming a fin-cut mask layer on the stopper layer 510 and planarizing the fin-cut mask layer. When the fin-cut mask layer is planarized, the stopper layer 510 may be planarized to remain in the third trench T3 and to be removed from the first field insulating layer 300 and the second fin mask pattern 220. Top surfaces of the stopper layer 510 and the fin-cut mask pattern 500 may be substantially coplanar with each other. In example embodiments, the stopper layer 510 may be removed except for a portion of the stopper layer 510 in the third trench T3, and then the fin-cut mask pattern 500 may be formed in the third trench T3 having the stopper layer 510. The stopper layer 510 may be formed on the sidewalls and the bottom surface of the third trench T3. In example embodiments, the stopper layer 510 may be formed on only the bottom surface of the third trench T3.

Figure 19:
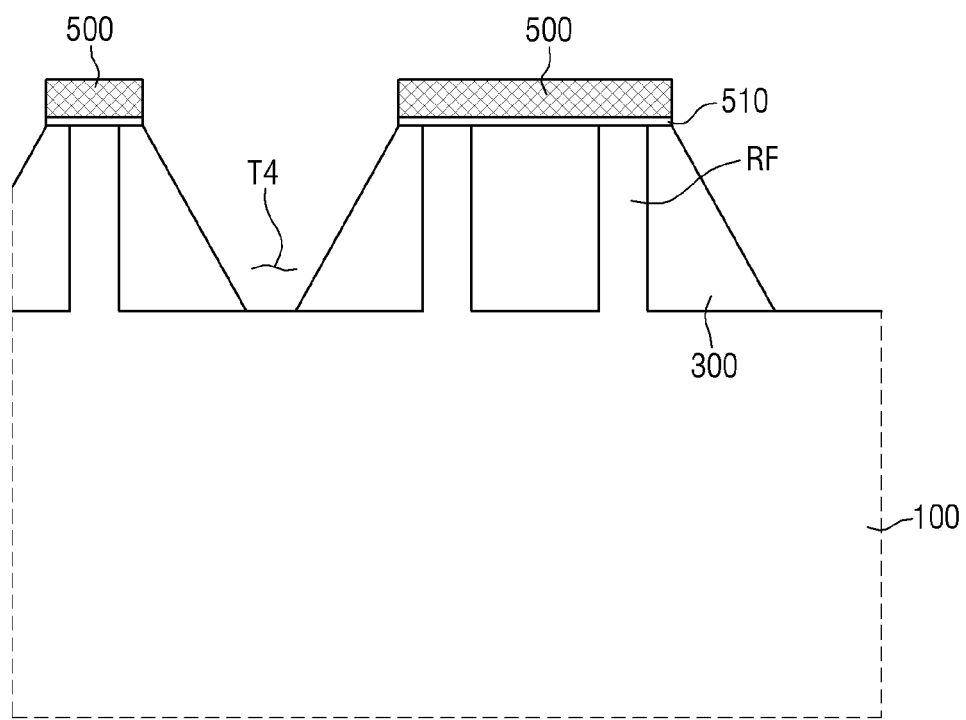

Referring to FIG. 19, a fourth trench T4 may be formed.

The fourth trench T4 may be formed by etching the first field insulating layer 300, the dummy fin-shaped pattern DF and the stopper layer 510. The substrate 100 may be exposed by the fourth trench T4. Bottom surfaces of the fourth trench T4 and the first field insulating layer 300 may be substantially coplanar with each other. In example embodiments, the bottom surface of the fourth trench T4 may be lower or higher than that of the first field insulating layer 300. The fourth trench T4 may have slanted sidewalls. That is, the first field insulating layer 300 may be etched to have a slanted profile. The fourth trench T4 may have a width decreasing in a downward direction from the fin-cut mask pattern 500 toward the substrate 100. This may be caused by a property of the etch process for forming the fourth trench T4.

The stopper layer 510 may be formed on the top surfaces of the first field insulating layer 300 and the real fin-shaped pattern RF, and under the fin-cut mask pattern 500. The stopper layer 510 may contact a bottom surface of the fin-cut mask pattern 500. The stopper layer 510 may cover the top surfaces of the real fin-shaped pattern RF and the first field insulating layer 300.

Figure 20:
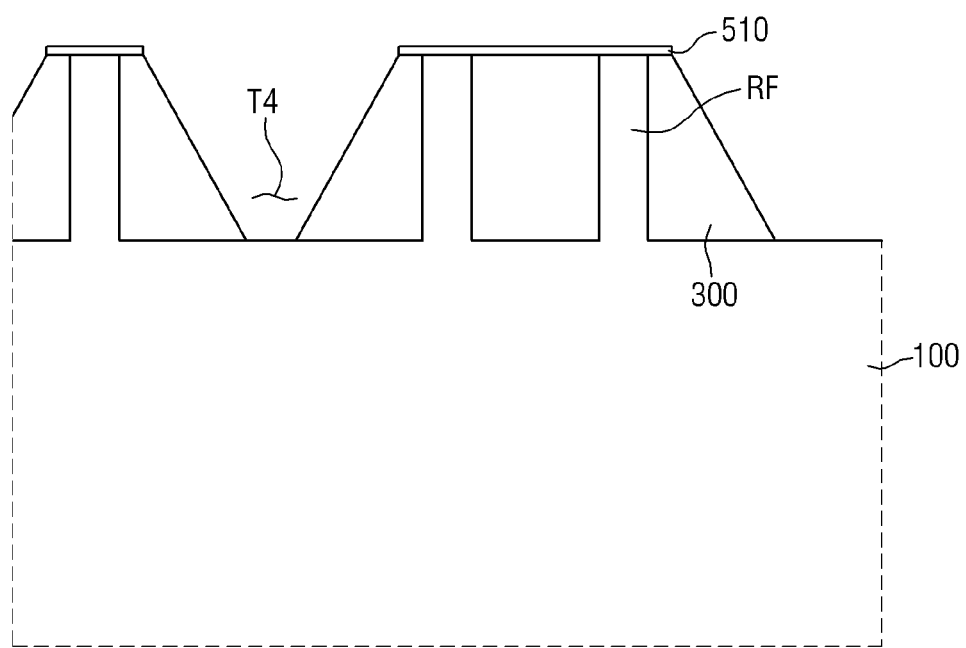

Referring to FIG. 20, the fin-cut mask pattern 500 may be removed.

As a result of the removal of the fin-cut mask pattern 500, the stopper layer 510 may be exposed. The top surfaces of the first field insulating layer 300 and the real fin-shaped pattern RF may be covered by the stopper layer 510. The stopper layer 510 may be disposed adjacent to both sides of the fourth trench T4 without being disposed within the fourth trench T4. The fin-cut mask pattern 500 may be removed by, for example, a wet etch process or a dry etch process.

Figure 21:
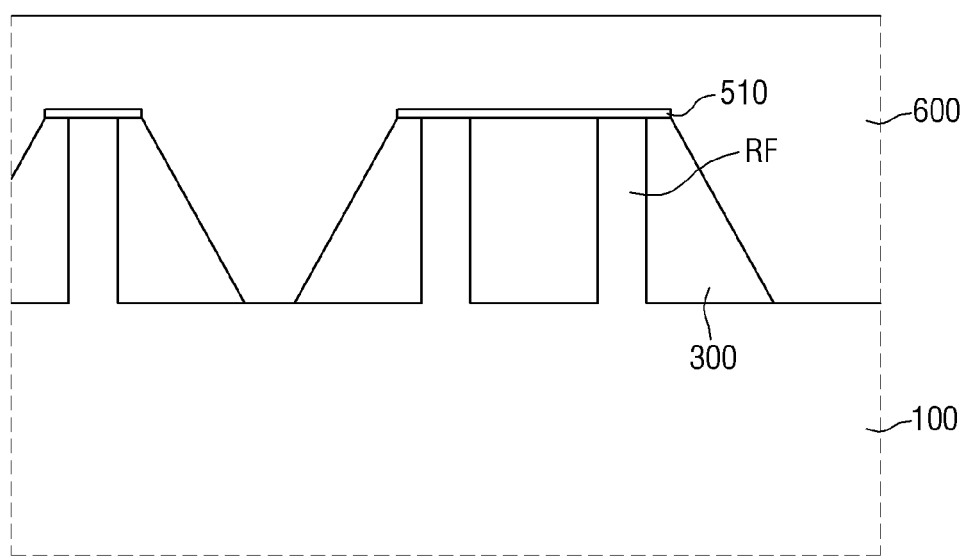

Referring to FIG. 21, a second field insulating layer 600 may be formed on the first field insulating layer 300 and the stopper layer 510.

The second field insulating layer 600 may fill the entirety of the fourth trench T4 and cover the top surfaces of the first field insulating layer 300 and the stopper layer 510. The top surface of the second field insulating layer 600 may be higher than those of the first field insulating layer 300 and the stopper layer 510.

The second field insulating layer 600 may include, for example, an oxide layer (e.g., silicon oxide layer), a nitride layer (e.g., silicon nitride layer), an oxynitride layer (e.g., silicon oxynitride layer), a low-k dielectric layer having a lower dielectric constant than silicon oxide, or a combination thereof. The second field insulating layer 600 may include the same material as that of the first field insulating layer 300. However, example embodiments of the inventive concept are not limited thereto.

Figure 22:
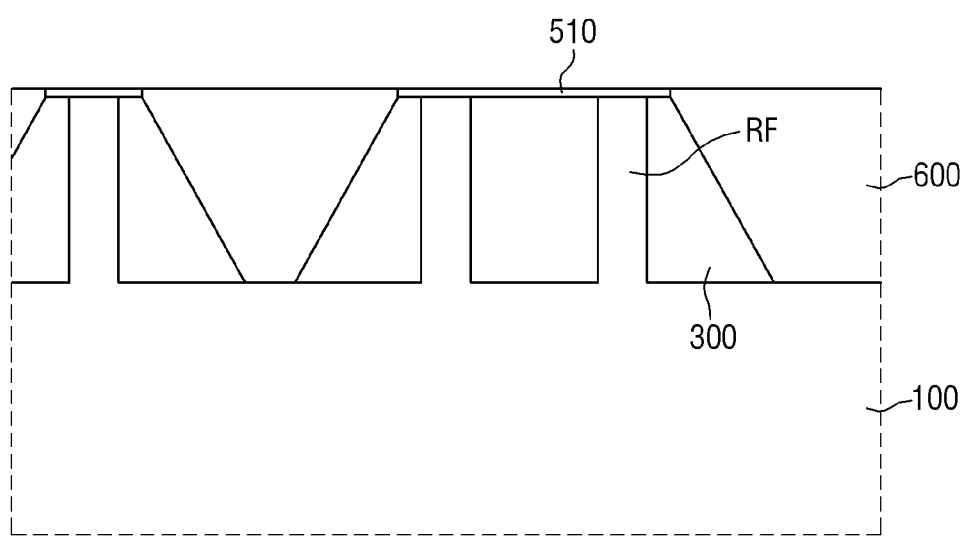

Referring to FIG. 22, The stopper layer 510 may be exposed by a planarization process.

The planarization process may include, for example, a chemical mechanical polishing (CMP) process. The stopper layer 510 may serve as a stopper during the planarization process. A portion of the second field insulating layer 600 may be removed until the stopper layer 510 is exposed through the planarization process. Therefore, the exposed top surface of the stopper layer 510 may be substantially coplanar with the planarized top surface of the second field insulating layer 600.

Figure 23:
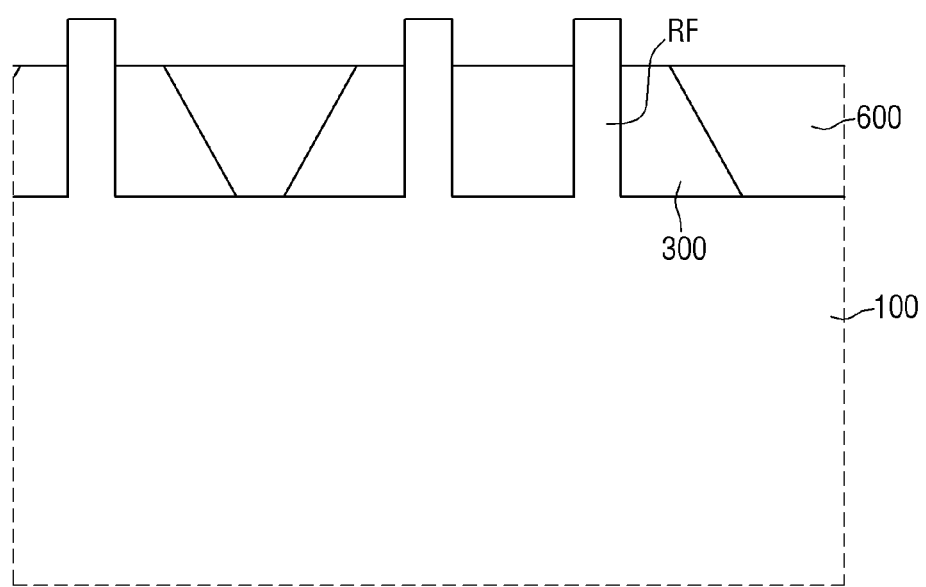

Referring to FIG. 23, the real fin-shaped pattern RF may be protruded by etching a portion of the first and second field insulating layers 300 and 600.

The stopper layer 510 may be removed, and then a portion of the first and second field insulating layers 300 and 600 may be removed. Thus, the real fin-shaped pattern RF may protrude above the first and second field insulating layers 300 and 600. A side surface of a lower portion of the real fin-shaped pattern RF may be covered by the first field insulating layer 300, and a side surface of an upper portion of the real fin-shaped pattern RF and a top surface of the real-fin shaped pattern RF may be exposed.

When the first and second field insulating layers 300 and 600 are formed of the same material, the first and second field insulating layers 300 and 600 may be removed by the same etch process so as to expose the upper portion of the real fin-shaped pattern RF.

Hereinafter, a method of fabricating a semiconductor device according to example embodiments of the inventive concept will be described with reference to FIGS. 1 to 4, 7 to 14, 24 and 25. For convenience of explanation, further descriptions of FIGS. 1 to 4 and 7 to 14 may be omitted herein.

Figure 24:
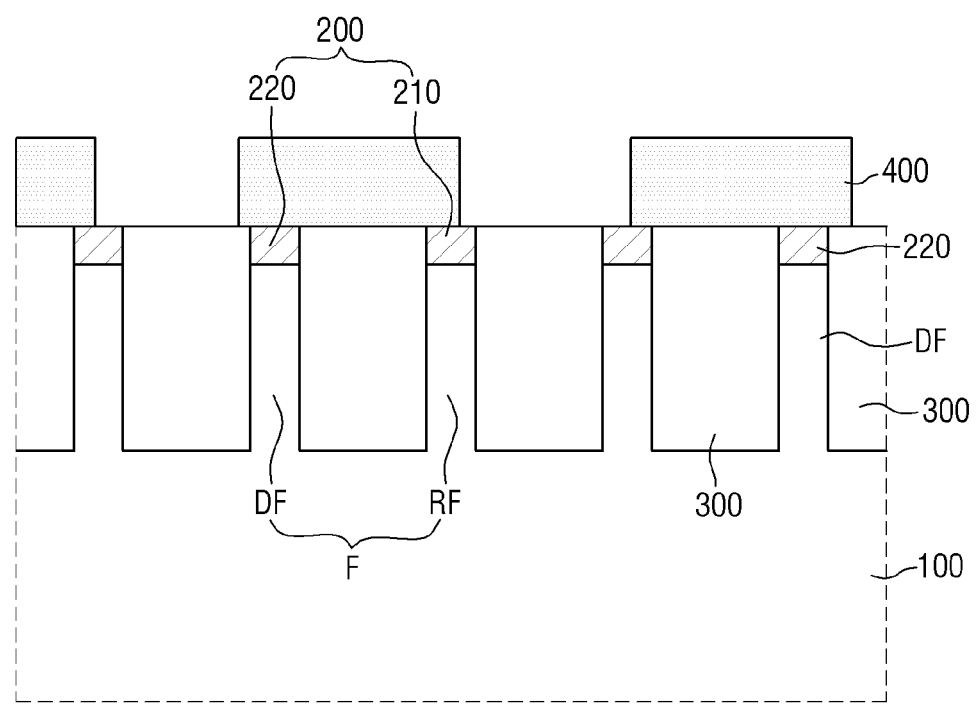
FIGS. 24 and 25 describe a method of fabricating a semiconductor device according to example embodiments of the inventive concept.

Referring to FIG. 24, a mask layer 400 may be formed to cover the second fin mask pattern 220 and to expose the first fin mask pattern 210.

The mask layer 400 may be patterned by, for example, a photolithography process or an etch process. The mask layer 400 may be patterned in a mis-aligned manner. For example, a portion of the mask layer 400 may overlap a portion of the first fin mask pattern 210 such that the mask layer 400 does not cover the entirety of the top surface of the first fin mask pattern 210.

When a fin-cut process is performed in such a way that a portion of the fin-shaped pattern F is etched using a mask layer 400 as an etch mask, a portion of the fin-shaped pattern F, which is covered by the mis-aligned mask layer 400, may not be removed and may remain, for example, as a spike-shaped pattern. As a result, performance of the semiconductor device may be decreased.

However, in a method of fabricating a semiconductor device according to example embodiments of the inventive concept, the remaining portion (e.g., the spike-shaped pattern) is not formed although the first fin mask pattern 210 overlaps a portion d3 of the mask layer 400, as described below.

Figure 25:
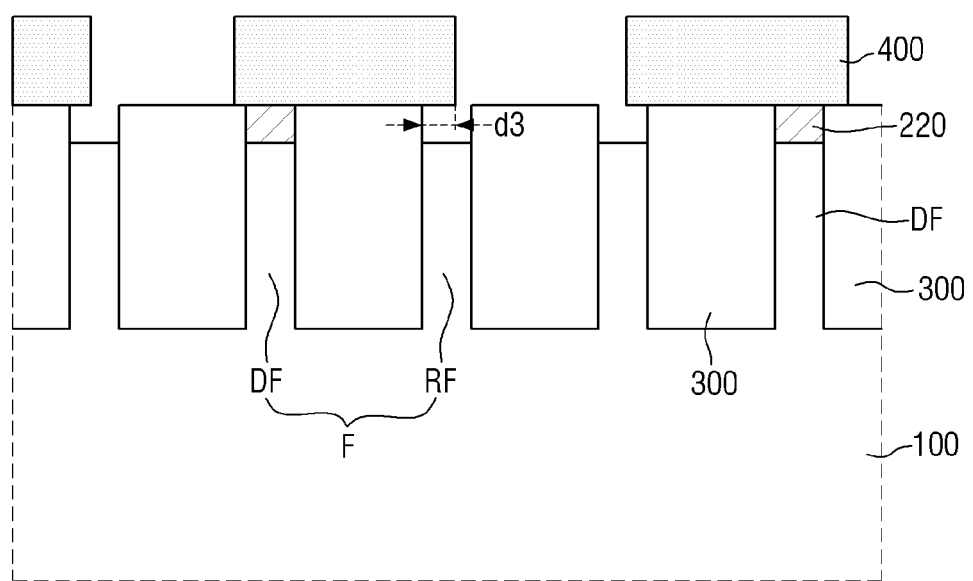

Referring to FIG. 25, the first fin mask pattern 210 may be removed.

The first fin mask pattern 210 may be removed through a portion of the first fin mask pattern 210 that is not overlapped with the mask layer 400 and is exposed. The first fin mask pattern 210 may be removed, for example, by a wet etch or a dry etch.

As a result, although the mask layer 400 is mis-aligned with the first fin mask pattern 210, the first fin mask pattern 210 may be selectively removed by exposing a portion of the first fin mask pattern 210. The overlap margin of the mask layer 400 may vary (e.g., the overlap margin of the mask layer 400 may be enlarged).

A method of fabricating a semiconductor device according to example embodiments of the inventive concept will be described with reference to FIGS. 26 to 37. In the example embodiments described with reference to FIGS. 26 to 37, the same elements previously described in the example embodiments described with reference to FIGS. 1 through 25 may be indicated by the same reference numerals or the same reference designators.

Figure 26:
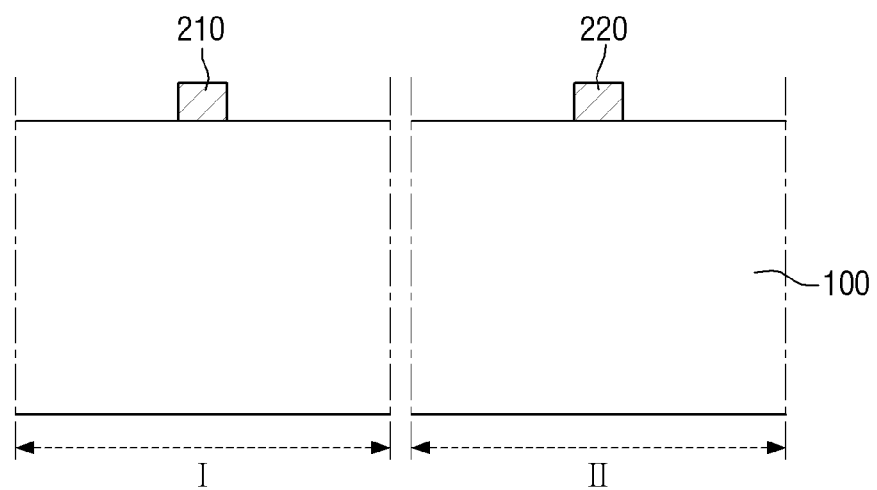
FIGS. 26 to 37 describe a method of fabricating a semiconductor device according to example embodiments of the inventive concept.

Referring to FIG. 26, a first fin mask pattern 210 may be formed in a first region I of a substrate 100 and a second fin mask pattern 220 may be formed in a second region II of the substrate 100.

The substrate 100 may include the first region I and the second region II. The first and second regions I and II may be adjacent to each other (e.g., directly adjacent to each other) or spaced apart from each other.

The first and second fin mask patterns 210 and 220 may include or be formed of the same material. In addition, the first and second fin mask patterns 210 and 220 may have the same shape as each other. However, example embodiments of the inventive concept are not limited thereto.

Figure 27:
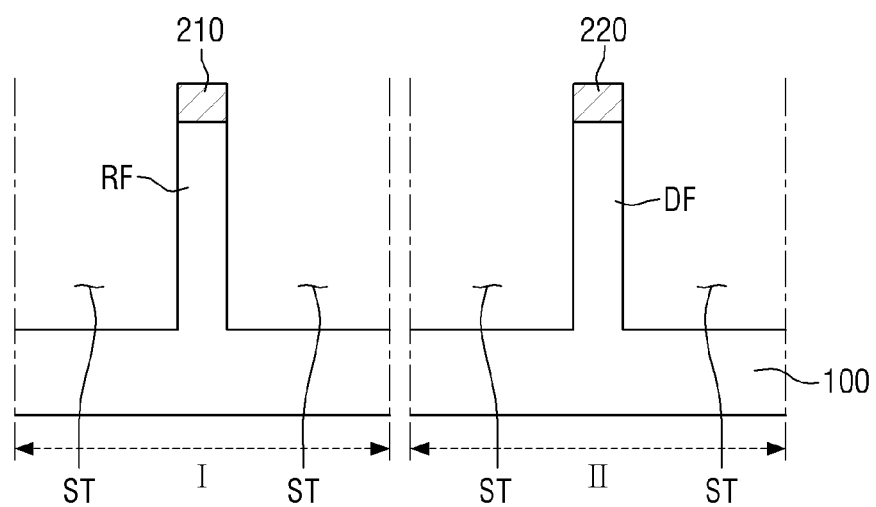

Referring to FIG. 27, the first region I and the second region II of the substrate 100 may be etched using the first fin mask pattern 210 and the second fin mask pattern 220 as an etch mask, respectively.

A real fin-shaped pattern RF may be formed in the first region I by etching the first region I of the substrate 100. The real fin-shaped pattern RF may protrude from the substrate 100. The real fin-shaped pattern RF may have a first side surface and a second side surface. A top surface of the real fin-shaped pattern RF may contact the first fin mask pattern 210. Further, a shallow trench ST may be formed to define the first and second side surfaces of the real fin-shaped pattern RF by etching the first region I of the substrate 100.

A dummy fin-shaped pattern DF may be formed in the second region II by etching the second region II of the substrate 100. The dummy fin-shaped pattern DF may protrude from the substrate 100. The dummy fin-shaped pattern DF may have a first side surface and a second side surface. A top surface of the dummy fin-shaped pattern DF may contact the second fin mask pattern 220. Further, a shallow trench ST may be formed at the first and second sides of the dummy fin-shaped pattern DF by etching the second region I of the substrate 100.

Figure 28:
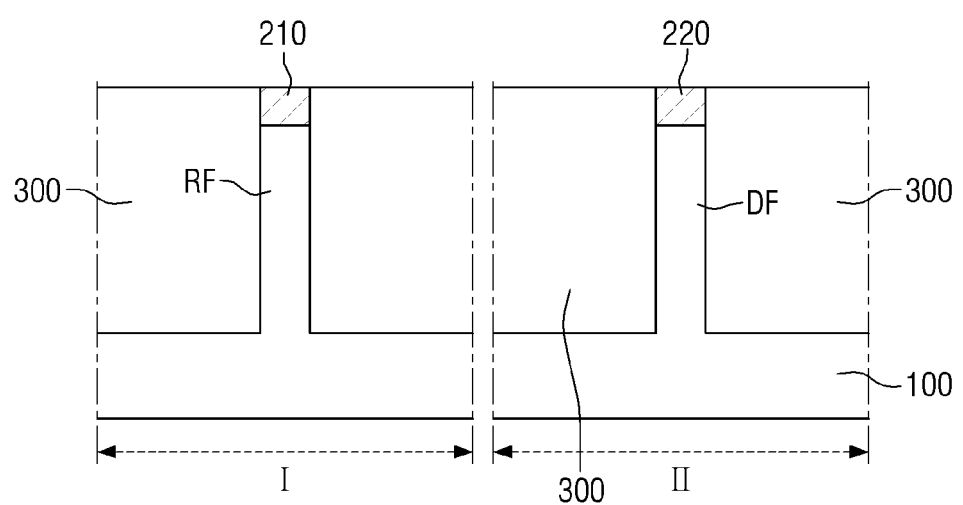

Referring to FIG. 28, a first field insulating layer 300 may be formed in the shallow trench ST.

The first field insulating layer 300 may fill the shallow trench ST. A planarization process may be performed on the first field insulating layer 300 and the first and second fin mask patterns 210 and 220. Accordingly, the first field insulating layer 300 may have a top surface substantially coplanar with top surfaces of the first and second fin mask patterns 210 and 220 (e.g., the top surfaces of the first field insulating layer 300, the first fin mask pattern 210, and the second fin mask pattern 220 may be substantially aligned with one another in a horizontal direction).

In the first region I, sidewalls of the first field insulating layer 300 may contact the real fin-shaped pattern RF and the first fin mask pattern 210. In the second region II, sidewalls of the first field insulating layer 300 may contact the dummy fin-shaped pattern DF and the second fin mask pattern 220.

Figure 29:
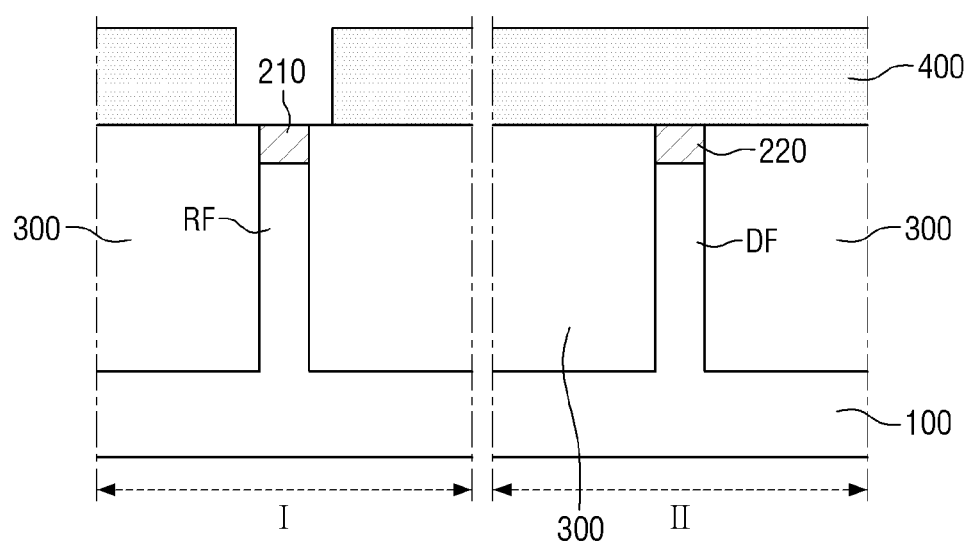

Referring to FIG. 29, a mask layer 400 may be formed to expose the first fin mask pattern 210 in the first region I and to cover the second fin mask pattern 220 in the second region II. In an example embodiment, the top surface of the second fin mask pattern 220 may be entirely covered by the mask layer 400, and the top surface of the first fin mask pattern 210 may be entirely exposed.

Figure 30:
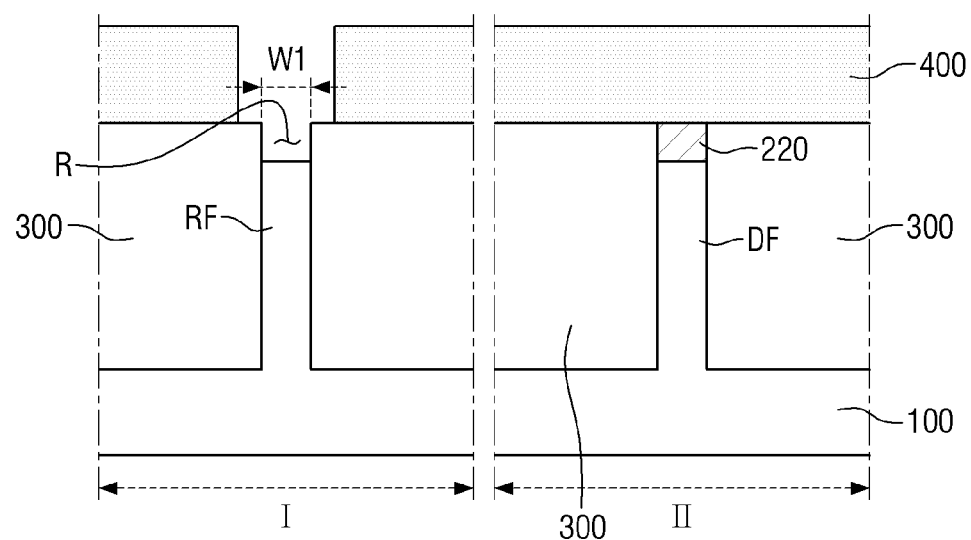

Referring to FIG. 30, the first fin mask pattern 210 may be removed in the first region I.

A recess R may be formed in the first region I as a result of the first fin mask pattern 210 being removed. The recess R may have a first width W1. In an example embodiment, the top surface of the real fin-shaped pattern RF may be exposed by the recess R, and the top surface of the dummy fin-shaped pattern DF is not exposed and may be covered by the second fin mask pattern 220.

Figure 31:
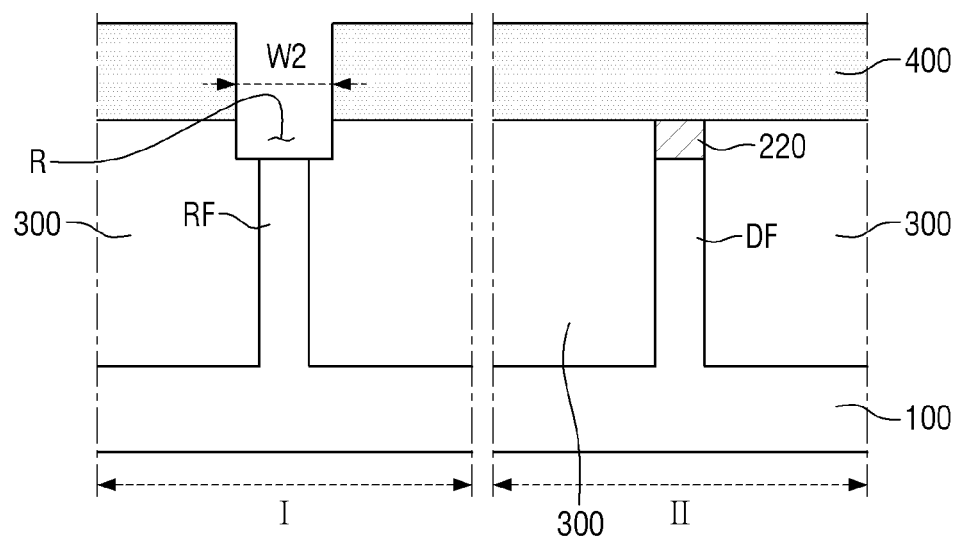

Referring to FIG. 31, the width of the recess R may be expanded.

The first width W1 of the recess R may be expanded to a second width W2. A portion of the first field insulating layer 300 in the first region I may be removed so that the first width W1 of the recess R is widened. The mask layer 400 may be used as an etch mask to remove a portion of the first field insulating layer 300 which is not overlapped with the mask layer 400. The second width W2 of the recess R may be greater than a width of the real fin-shaped pattern RF.

Figure 32:
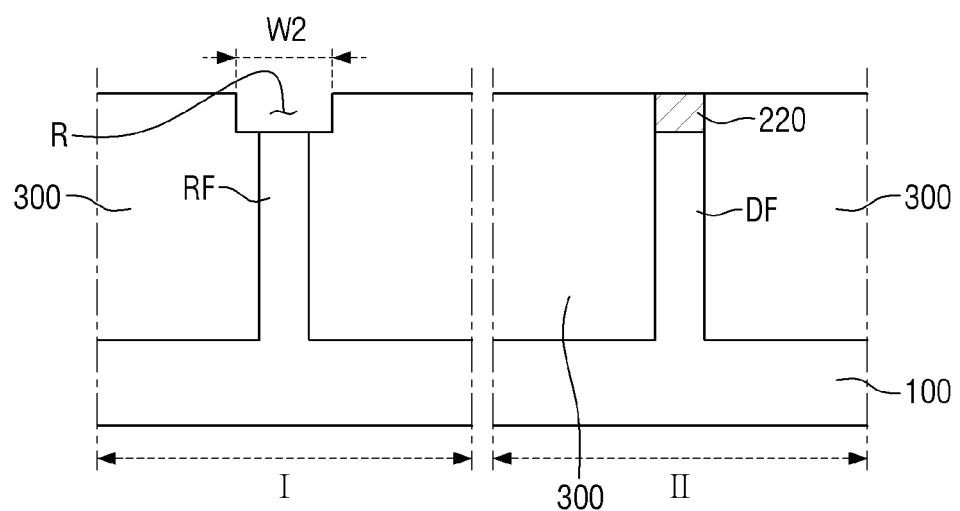

Referring to FIG. 32, the mask layer 400 may be removed.

Since the mask layer 400 is removed, the top surface of the second fin mask pattern 220 in the second region II may be exposed, and the expanded recess R in the first region I may be exposed.

Figure 33:
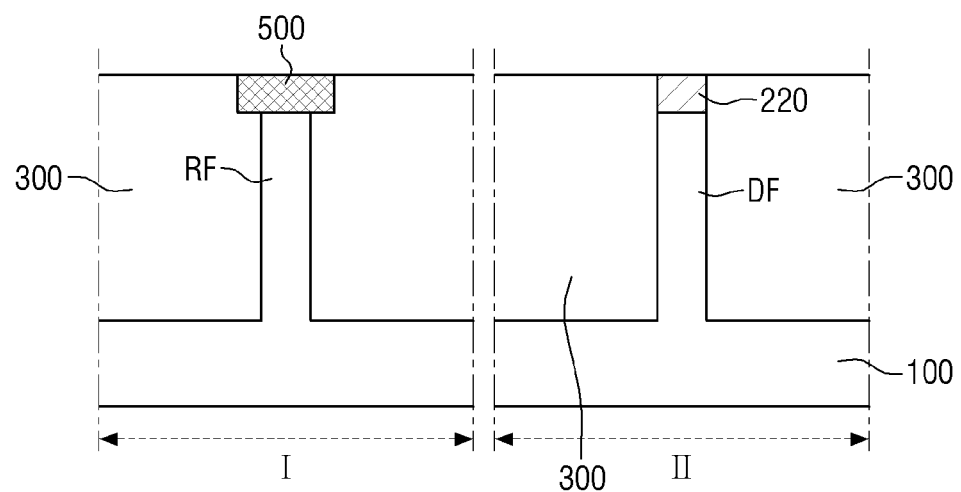

Referring to FIG. 33, a fin-cut mask pattern 500 may be formed in the recess R in the first region I.

The fin-cut mask pattern 500 may fill the entirety of the recess R. The fin-cut mask pattern 500 may be formed only in the first region I. The fin-cut mask pattern 500 may be formed to cover the top surface of the real fin-shaped pattern RF. The fin-cut mask pattern 500 may overlap a portion of the first field insulating layer 300 in the first region I.

Figure 34:
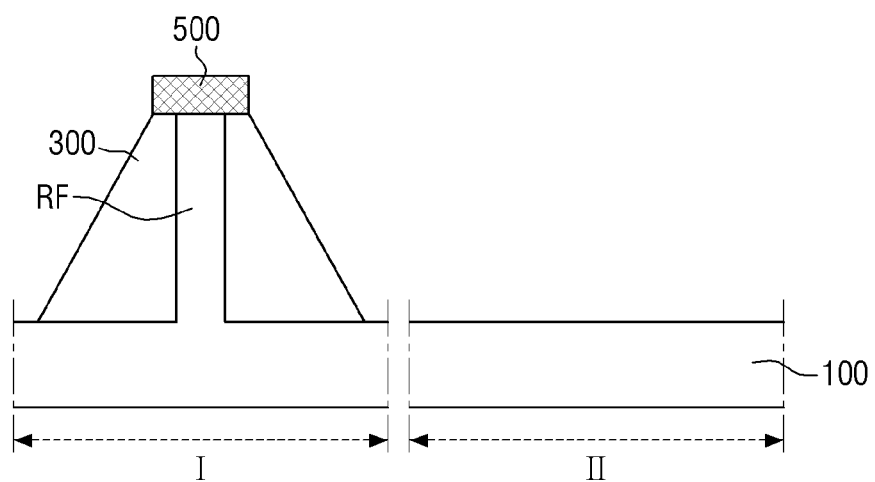

Referring to FIG. 34, the second fin mask pattern 220 and the dummy fin-shaped pattern DF may be removed.

In the second region II, the second fin mask pattern 220 and the dummy fin-shaped pattern DF may be removed. In the first region I, the first field insulating layer 300 may be etched using the fin-cut mask pattern 500 as an etch mask. The first field insulating layer 300 in the first region I may be etched to have a sloped profile. For example, a width of the first field insulating layer 300 may be gradually reduced in a direction away from the substrate 100 and toward the fin-cut mask pattern 500. However, example embodiments of the inventive concept are not limited thereto.

Figure 35:
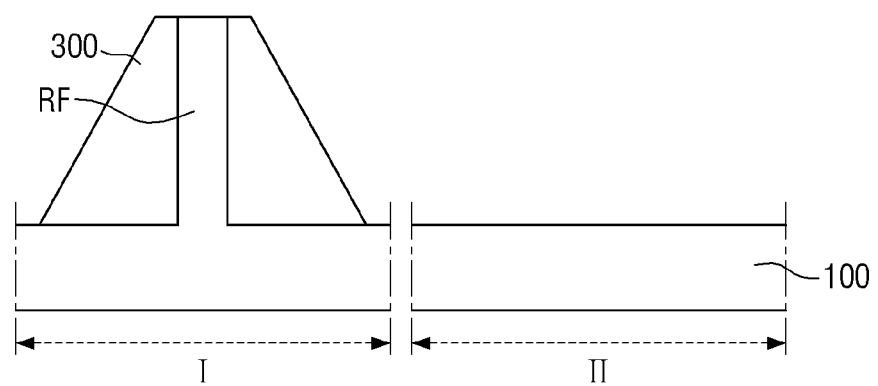

Referring to FIG. 35, the fin-cut mask pattern 500 may be removed.

As the fin-cut mask pattern 500 is removed in the first region I, the top surface of the real fin-shaped pattern RF may be exposed. In addition, the top surface of the first field insulating layer 300 may be exposed.

Figure 36:
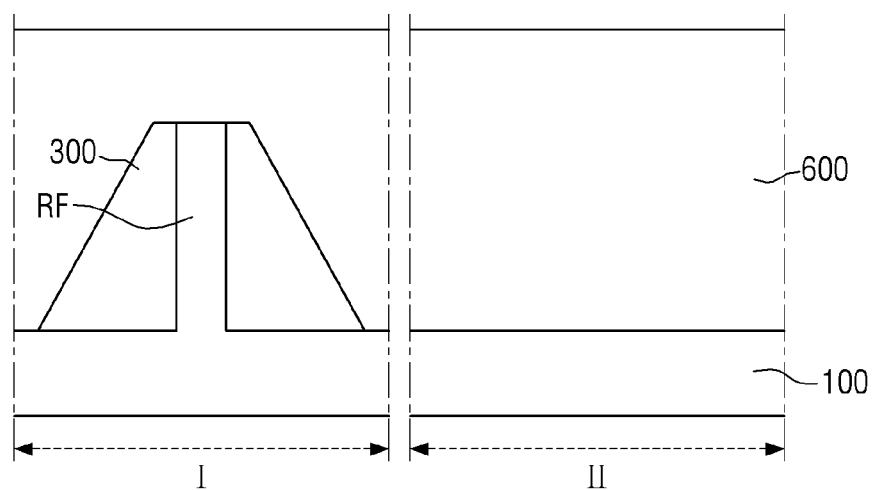

Referring to FIG. 36, a second field insulating layer 600 may be formed.

The second field insulating layer 600 may be formed on the real fin-shaped pattern RF and the first field insulating layer 300 in the first region I. The second field insulating layer 600 may be formed on the substrate in the second region II. The second field insulating layer 600 may be formed to have substantially the same height in the first and second regions I and II. However, example embodiments of the inventive concept are not limited thereto.

The second field insulating layer 600 may include or be formed of the same material as the first field insulating layer 300, however example embodiments of the inventive concept are not limited thereto.

Figure 37:
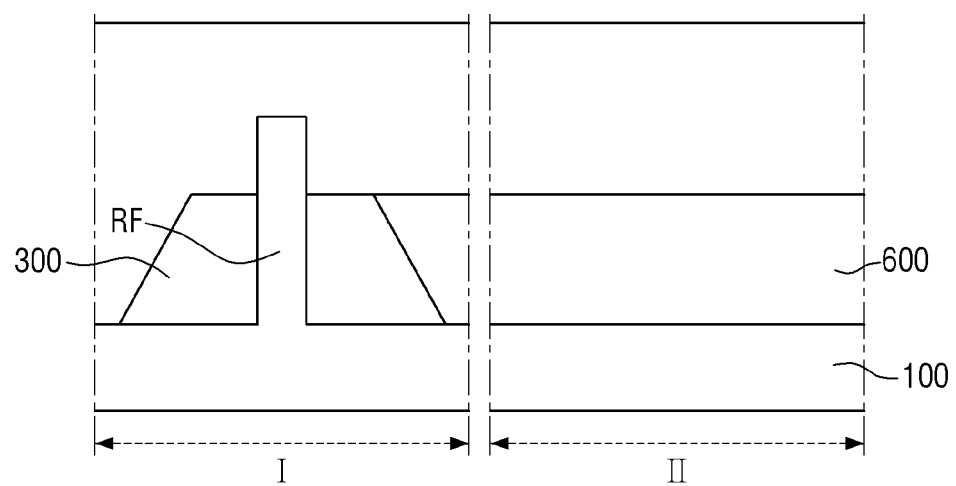

Referring to FIG. 37, the real fin-shaped pattern RF may protrude above the first and second field insulating layers 300 and 600.

The real fin-shaped pattern RF may be protruded by etching a portion of the first field insulating layer 300 and a portion of the second field insulating layer 600 in the first region I. Thus, an upper portion of the real fin-shaped pattern RF may be exposed and a lower portion of the real fin-shaped pattern RF may contact and be covered by the first field insulating layer 300. Top surfaces of the first and second field insulating layers 300 and 600 may be substantially coplanar with each other.

In the second region II, the second field insulating layer 600 may be partially etched to have substantially the same height as the top surface of the first field insulating layer 300 in the first region I.

A method of fabricating a semiconductor device according to example embodiments of the inventive concept will be described with reference to FIGS. 26 to 32 and 38 to 42. For convenience of explanation, a further descriptions of the example embodiments previously described with reference to FIGS. 26 to 32 may be omitted herein.

Figure 38:
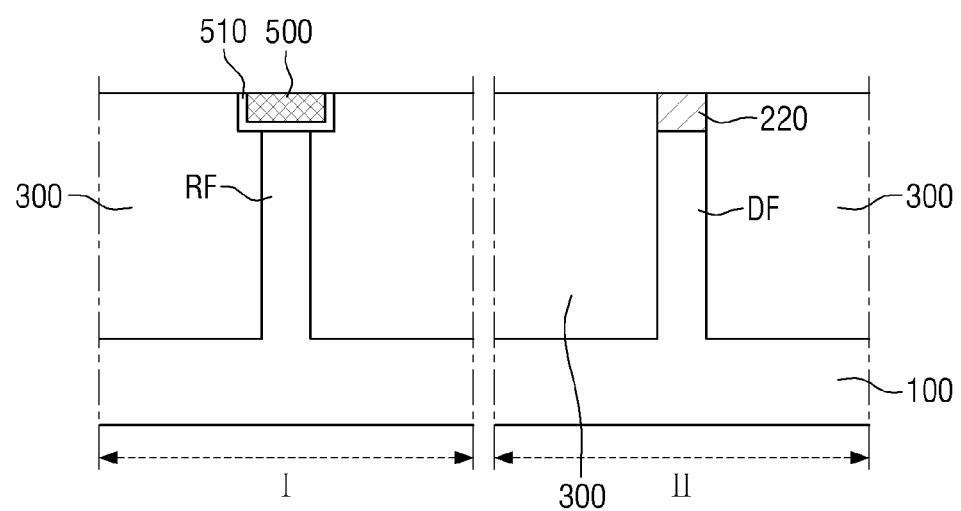
FIGS. 38 to 42 describe a method of fabricating a semiconductor device according to example embodiments of the inventive concept.

Referring to FIG. 38, a stopper layer 510 and a fin-cut mask pattern 500 may be formed in the recess R in the first region I.

The stopper layer 510 may be conformally formed along the inner surfaces of the recess R. For example, the stopper layer 510 may be formed along and contact all of the inner surfaces of the recess R. The stopper layer 510 may not fill the entirety of the recess R. The fin-cut mask pattern 500 may be formed on the stopper layer 510 in the recess R. Together, the fin-cut mask pattern 500 and the stopper layer 510 may fill the entirety of the recess R. The stopper layer 510 and the fin-cut mask pattern 500 may be formed to have top surfaces that are substantially coplanar with each other as the result of a planarization process.

Figure 39:
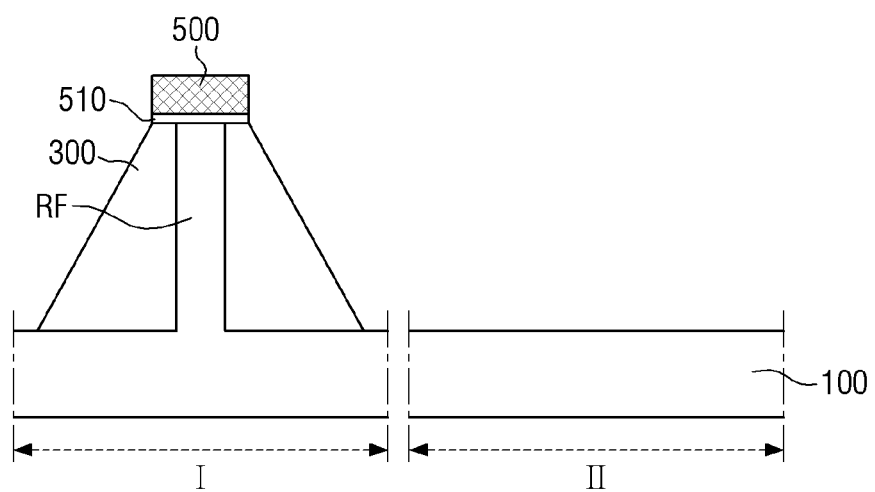

Referring to FIG. 39, the second fin mask pattern 220 and the dummy fin-shaped pattern DF may be removed.

In the second region II, the second fin mask pattern 220 and the dummy fin-shaped pattern DF may be removed. A portion of the stopper layer 510 and a portion of the first field insulating layer 300 may be etched using the fin-cut mask pattern 500 as an etch mask in the first region I. The first field insulating layer 300 may be etched to have a sloped profile. For example, a width of the first field insulating layer 300 may gradually decrease in a direction away from the substrate 100 and toward the fin-cut mask pattern 500. However, example embodiments are not limited thereto.

Figure 40:
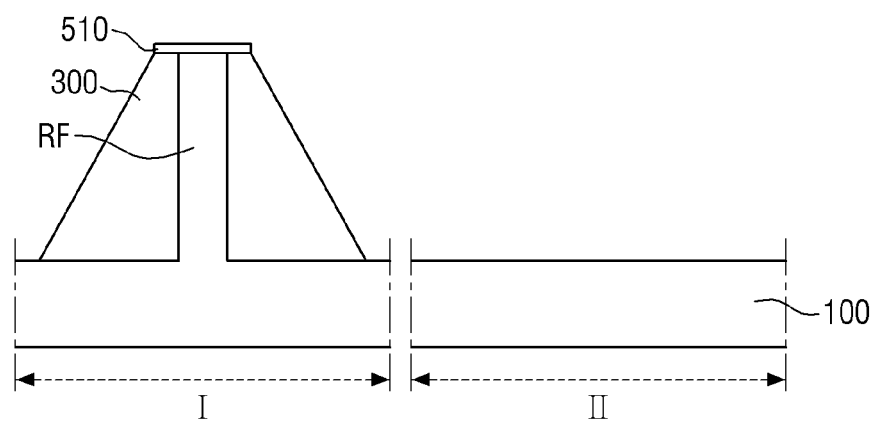

Referring to FIG. 40, the fin-cut mask pattern 500 may be removed.

As the fin-cut mask pattern 500 is removed in the first region I, a top surface of the stopper layer 510 may be exposed. The stopper layer 510 may still cover the top surface of the first field insulating layer 300.

Figure 41:
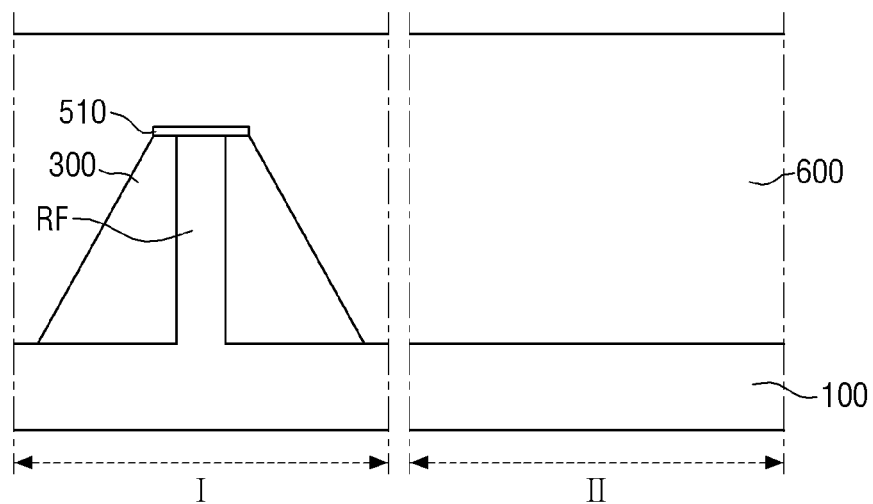

Referring to FIG. 41, a second field insulating layer 600 may be formed.

The second field insulating layer 600 may be formed on the stopper layer 510 and the first field insulating layer 300 in the first region I. The second field insulating layer 600 may be formed on the substrate 100 in the second region II. The second field insulating layer 600 may be formed to have the same height from the substrate 100 in both the first and second regions I and II. However, example embodiments are not limited thereto.

The second field insulating layer 600 may include the same material as the first field insulating layer 300, however example embodiments are not limited thereto.

Figure 42:
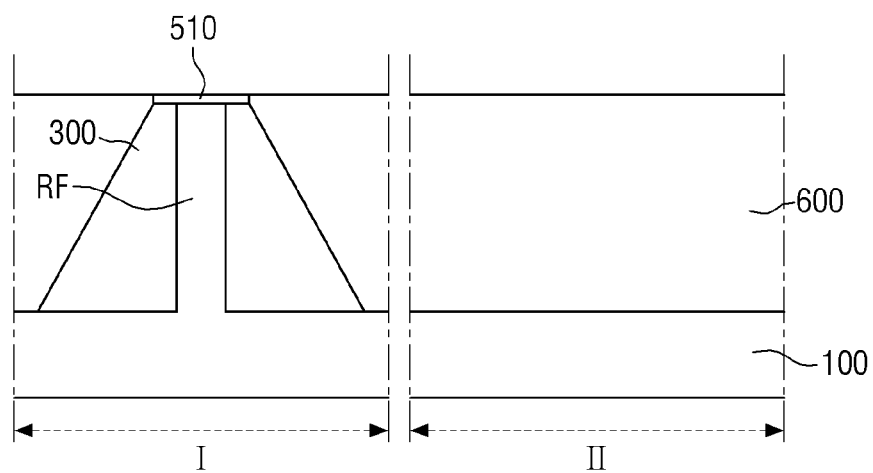

Referring to FIG. 42, the stopper layer 510 may be exposed through a planarization process.

The planarization process may be, for example, a chemical mechanical polishing (CMP) process. The stopper layer 510 may be used as a stopper during the planarization process. For example, in the first region I, a portion of the second field insulating layer 600 may be removed by the planarization process until the stopper layer 510 is exposed.

Accordingly, the top surface of the stopper layer 510 may be substantially coplanar with the planarized top surface of the second field insulating layer 600.

In the second region II, the stopper layer 510 may not be disposed. The planarized second field insulating 600 may have substantially the same height in the first and second regions I and II. However, example embodiments of the inventive concept are not limited thereto.

Referring back to FIG. 37, the real fin-shaped pattern may protrude above the first and second field insulating layers 300 and 600.

The stopper layer 510 may be removed and then a portion of the first field insulating layer 300 and a portion of the second field insulating layer 600 may be removed. Thus, the real fin-shaped pattern RF may be protruded. That is, an upper portion of the real fin-shaped pattern RF may be exposed, and a lower portion of the real fin-shaped pattern may contact and be covered by the first field insulating layer 300. Here, the first field insulating layer 300 and the second field insulating layer 600 may have top surfaces which are substantially coplanar with each other.

One portion of the second field insulating layer 600 in the second region II may be etched to have substantially the same height as another portion of the second field insulating layer 600 in the first region I.

A method of fabricating a semiconductor device according to example embodiments of the inventive concept will be described with reference to FIGS. 26 to 28, 31 to 37, 43 and 44. For convenience of explanation, further descriptions of the example embodiments previously described with reference to FIGS. 26 to 28 and 31 to 37 may be omitted herein.

Figure 43:
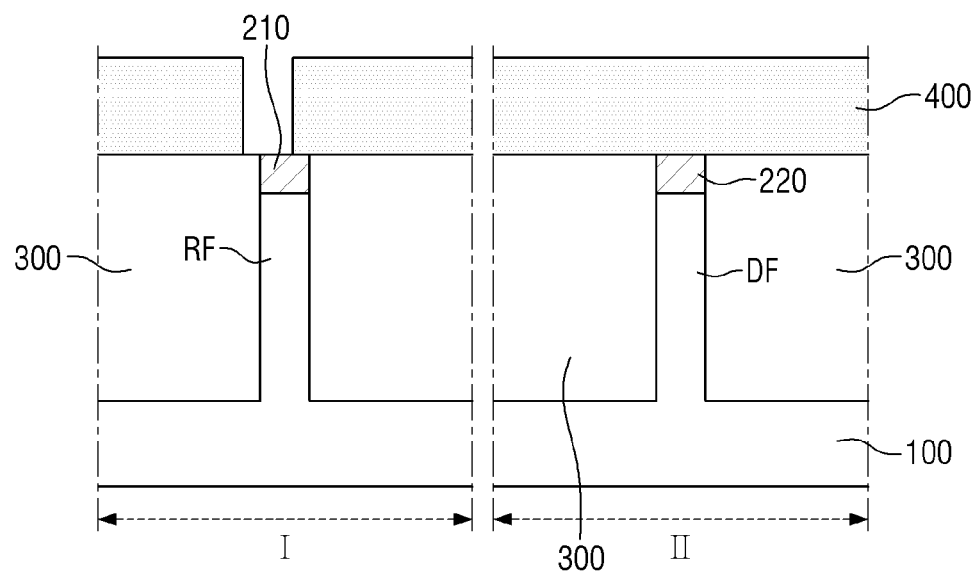
FIGS. 43 and 44 describe a method of fabricating a semiconductor device according to example embodiments of the inventive concept.

Referring to FIG. 43, a mask layer 400 exposing the first fin mask pattern 210 may be formed to cover the second fin mask pattern 220.

The mask layer 400 may be formed to partially overlap the first fin mask pattern 210 in the first region I. At least a portion of a top surface of the first fin mask pattern 210 may be exposed, allowing the first fin mask pattern 210 to be subsequently removed via the exposed area. The mask layer 400 may overlap the first field insulating layer 300 in the first region I.

In second region II, the mask layer 400 may cover the entirety of the second fin mask pattern 220 and may overlap the first field insulating layer 300.

Figure 44:
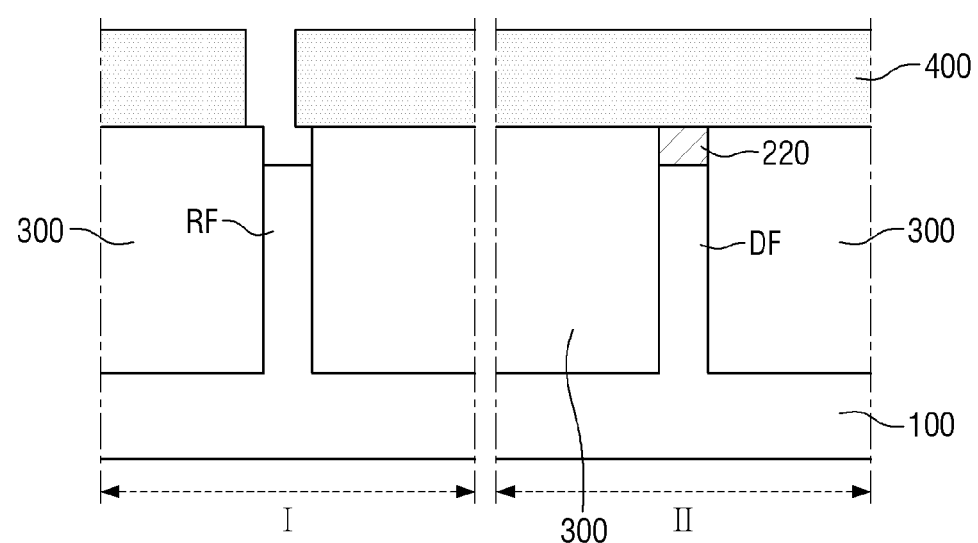

Referring to FIG. 44, the first fin mask pattern 210 may be removed.

In the first region I, the first fin mask pattern 210 may be removed through the exposed portion which is not overlapped with the mask layer 400. Here, the first fin mask pattern 210 may be removed by, for example, a wet etch or a dry etch.

According to example embodiments of the inventive concept, although the mask layer 400 is mis-aligned, the first fin mask pattern 210 may be selectively removed through an exposed portion of the first fin mask pattern 210. As a result, an overlap margin of the mask layer 400 may be enlarged.

Next, the processes of the example embodiments described with reference to FIGS. 31 to 37 may be performed.

Figure 45:
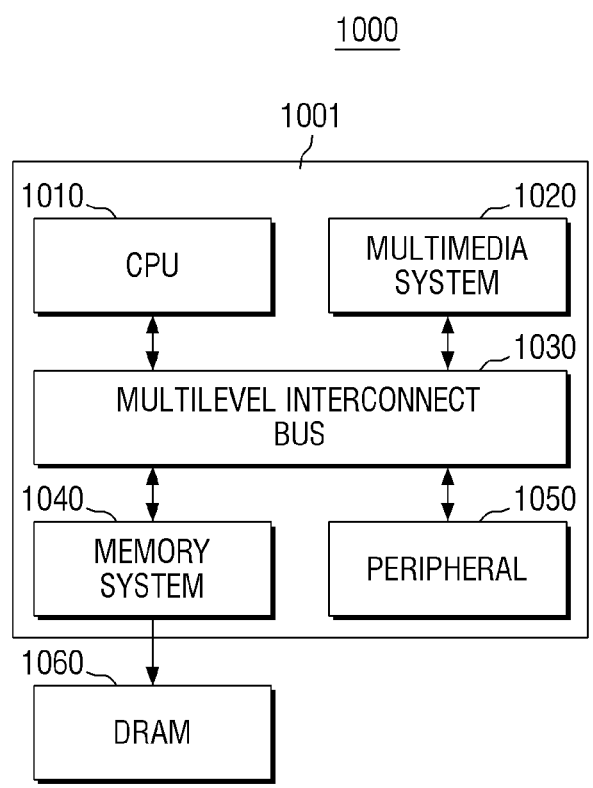
FIG. 45 is a block diagram of a system-on-chip (SoC) system including one or more semiconductor devices fabricated according to example embodiments of the inventive concept.

FIG. 45 is a block diagram of a system-on-chip (SoC) system including one or more semiconductor devices fabricated according to the methods of the example embodiments of the inventive concept described herein.

Referring to FIG. 45, the SoC system may include an application processor 1001 and DRAM 1060.

The application processor 1001 may include a central processing unit (CPU) 1010, a multimedia system 1020, a bus 1030, a memory system 1040, and a peripheral circuit 1050.

The central processing unit 1010 may perform operations necessary for operating the SoC system 1000. In example embodiments, the central processing unit 1010 may be configured in a multi-core environment including a plurality of cores.

The multimedia system 1020 may be used to perform a variety of multimedia functions in the SoC system 1000. The multimedia system 1020 may include, for example, a 3D engine module, a video codec, a display system, a camera system, and a post-processor. However, example embodiments of the inventive concept are not limited thereto.

The bus 1030 may be used to perform data communication among the central processing unit 1010, the multimedia system 1020, the memory system 1040, and the peripheral circuit 1050. In example embodiments, the bus 1030 may have a multi-layered structure. Examples of the bus 1030 may include a multi-layer advanced high-performance bus (AHB), or a multi-layer advanced eXtensible interface (AXI). However, example embodiments of the inventive concept are not limited thereto.

The memory system 1040 may provide environments necessary for high-speed operation by connecting the AP 1001 to an external memory (for example, the DRAM 1060). In example embodiments, the memory system 1040 may include a separate controller (for example, a DRAM controller) for controlling the external memory (for example, the DRAM 1060).

The peripheral circuit 1050 may provide environments necessary for smoothly connecting the SoC system 1000 to an external device (for example, a main board). Accordingly, the peripheral circuit 1050 may include various kinds of interfaces enabling the external device connected to the SoC system 1000 to be compatibly used.

The DRAM 1060 may function as a working memory required to operate the AP 1001. In example embodiments, as shown, the DRAM 1060 may be disposed outside the AP 1001. For example, the DRAM 1060 may be packaged with the AP 1001 in the form of a package on package (PoP).

Each of the central processing unit 1010, the multimedia system 1020, the memory system 1040, the peripheral circuit 1050 and DRAM 1060 may be embodied by one or more semiconductor devices described herein according to example embodiments of the inventive concept.

Figure 46:
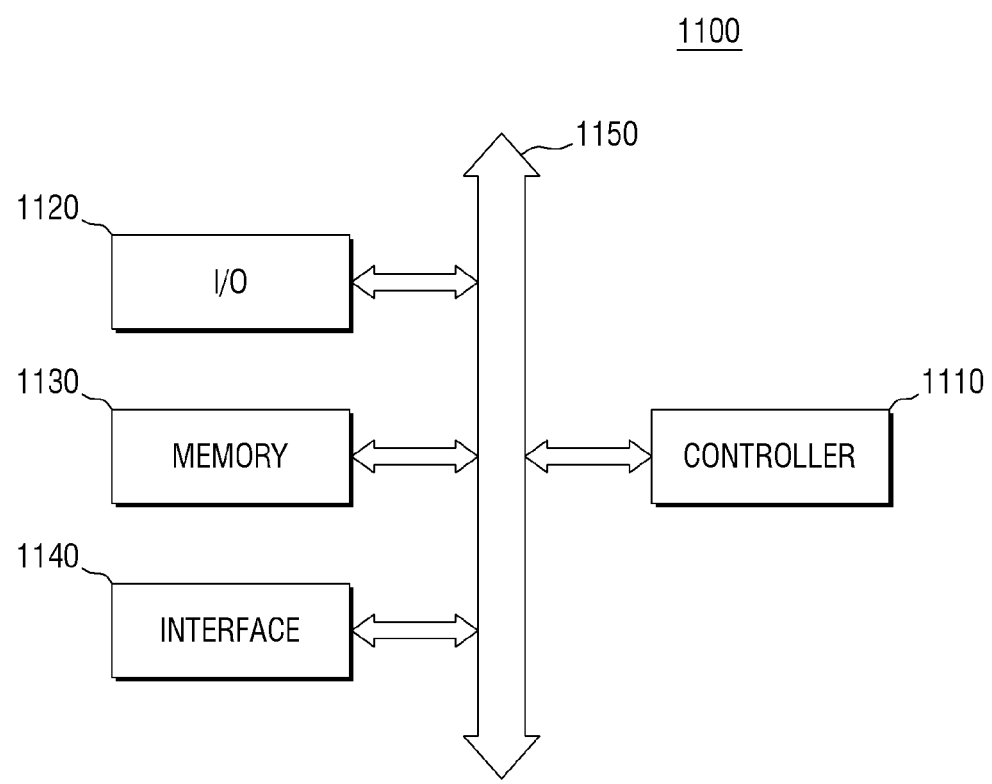
FIG. 46 is a block diagram of an electronic system including one or more semiconductor devices fabricated according to example embodiments of the inventive concept.

FIG. 46 is a block diagram of an electronic system including one or more semiconductor devices fabricated according to the methods of the example embodiments of the inventive concept described herein.

Referring to FIG. 46, the electronic system 1100 may include a controller 1110, an input/output device (I/O) 1120, a memory device 1130, an interface 1140 and a bus 1150. The controller 1110, the I/O 1120, the memory device 1130, and/or the interface 1140 may be connected to each other through the bus 1150. The bus 1150 corresponds to a path through which data is communicated.

The controller 1110 may include, for example, at least one of a microprocessor, a digital signal processor, a microcontroller, and logic elements capable of performing functions similar to those of these elements. The I/O 1120 may include, for example, a key pad, a key board, a display device, a touchscreen interface, etc. The memory device 1130 may store data and/or commands. The interface 1140 may perform functions of transmitting data to a communication network or receiving data from the communication network. The interface 1140 may be wired or wireless. For example, the interface 1140 may include an antenna and/or a wired/wireless transceiver. The electronic system 1100 may further include high-speed DRAM and/or SRAM as the working memory for improving the operation of the controller 1110. Here, one or more semiconductor devices described herein according to example embodiments of the inventive concept may be provided in the memory device 1130 or may be provided via some components of the controller 1110 or the I/O 1120.

The electronic system 1100 may be applied to, for example, a personal digital assistant (PDA), a portable computer, a web tablet, a wireless phone, a mobile phone, a digital music player, a memory card, a smartphone, or any type of electronic device capable of transmitting and/or receiving information in a wireless environment.

It is to be understood that the semiconductor devices fabricated according to the methods of example embodiments of the inventive concept described herein may be applied to a variety of integrated circuit (IC) devices including, but not limited to, a tablet PC, a notebook computer, a smartphone, etc. In example embodiments of the inventive concept, the semiconductor device may be implemented as, for example, a computer, an ultra mobile personal computer (UMPC), a work station, a net-book, a personal digital assistant (PDA), a portable computer, a web tablet, a wireless phone, a mobile phone, a smartphone, an e-book, a portable multimedia player (PMP), a potable game console, a navigation device, a black box, a digital camera, a 3-dimensional (3D) television, a digital audio recorder, a digital audio player, a digital picture recorder, a digital picture player, a digital video recorder, a digital video player, etc.

While the inventive concept has been particularly shown and described with reference to the example embodiments thereof, it will be understood by those of ordinary skill in the art that various changes in form and detail may be made therein without departing from the spirit and scope of the inventive concept as defined by the following claims.

What is claimed is:

1. A method of fabricating a semiconductor device, comprising:
    forming a first fin-shaped pattern having a first fin mask pattern disposed thereon on a substrate;
    forming a second fin-shaped pattern having a second fin mask pattern disposed thereon on the substrate;
    forming a first trench by removing the first fin mask pattern, wherein a width of the first trench is greater than or equal to a width of the first fin-shape pattern;
    forming a fin-cut mask pattern filling the first trench; and
    removing the second fin mask pattern and the second fin-shaped pattern using the fin-cut mask pattern as a first etch mask.

2. The method of claim 1, wherein forming the first fin-shaped pattern and the second fin-shaped pattern comprises:
forming a second trench defining the first fin-shaped pattern and the second fin-shaped pattern by removing a portion of the substrate.

3. The method of claim 2, further comprising:
forming a first field insulating layer filling the second trench.

4. The method of claim 3, wherein the first field insulating layer covers side surfaces of the first and second fin mask patterns.

5. The method of claim 3, wherein forming the first trench comprises;
forming a recess by removing a portion of the first fin mask pattern; and
expanding a width of the recess by removing a portion of the first field insulating layer.

6. The method of claim 5, wherein forming the fin-cut mask pattern comprises:
covering a top surface of the first fin-shaped pattern and a first portion of the first field insulating layer exposed by the first trench with the fin-cut mask pattern.

7. The method of claim 6, wherein removing the second fin mask pattern and the second fin-shaped pattern further comprises:
removing a second portion of the first field insulating layer.

8. The method of claim 7, wherein removing the second portion of the first field insulating layer comprises:
etching the second portion of the first field insulating layer to form a third trench having a slanted sidewall.

9. The method of claim 7, further comprising:
removing the fin-cut mask pattern;
forming a second field insulating layer on the first field insulating layer and the substrate to cover the first fin-shaped pattern; and
removing a third portion of the first field insulating layer and a portion of the second field insulating layer,
wherein the first fin-shaped pattern protrudes above the first and second field insulating layers upon removal of the third portion of the first field insulating layer and the portion of the second field insulating layer.

10. The method of claim 7, further comprising:
removing the fin-cut mask pattern and the first field insulating layer;
forming a second field insulating layer on the substrate to cover the first fin-shaped pattern; and
removing a portion the second field insulating layer,
wherein the first fin-shaped pattern protrudes above the second field insulating layer upon removal of the portion of the second field insulating layer.

11. The method of claim 1, wherein removing the first fin mask pattern comprises:
forming a mask layer on the second fin mask pattern, wherein the mask layer exposes the first fin mask pattern; and
removing the first fin mask pattern using the mask layer as a second etch mask.

12. The method of claim 1, further comprising:
forming a stopper layer in the first trench and on the second fin mask pattern;
forming the fin-cut mask pattern filling the first trench on the stopper layer in the first trench; and
removing a portion of the stopper layer to expose a top surface of the second fin mask pattern.

13. The method of claim 12, further comprising:
removing the fin-cut mask pattern to expose the stopper layer after removing the second fin mask pattern and the second fin-shaped pattern.

14. The method of claim 13, further comprising:
forming a field insulating layer covering the first fin-shaped pattern and the stopper layer after removing the fin-cut mask pattern; and
removing the stopper layer and a portion of the field insulating layer,
wherein the first fin-shaped pattern protrudes above the field insulating layer upon removing the stopper layer and the portion of the field insulating layer.

15. The method of claim 14, wherein removing the stopper layer and the portion of the field insulating layer comprises:
planarizing the field insulating layer to expose the stopper layer; and
removing the stopper layer and the portion of the field insulating layer after planarizing the field insulating layer.

16. A method of fabricating a semiconductor device, comprising:
forming a fin-shaped structure including a first fin-shaped pattern, a second fin-shaped pattern, a first trench disposed between the first and second fin-shaped patterns, a first field insulating layer filling the first trench, a first fin mask pattern disposed on the first fin-shaped pattern, and a second fin mask pattern disposed on the second fin-shaped pattern;
forming a first mask pattern covering the second fin mask pattern and exposing the first fin mask pattern;
forming a second trench exposing the first fin-shaped pattern by etching the fin-shaped structure using the first mask pattern as an etch mask;
forming a second mask pattern filling the second trench; and
forming a third trench by etching the second fin mask pattern and the second fin-shaped pattern using the second mask pattern as an etch mask,
wherein a bottom surface of the third trench is positioned at substantially a same level as or lower than a bottom surface of the first field insulating layer.

17. The method of claim 16, further comprising:
removing the second mask pattern; and
forming a second field insulating layer filling the third trench.

18. The method of claim 17, further comprising:
etching the first field insulating layer and the second field insulating layer to expose a portion of a sidewall and a top surface of the first fin-shaped pattern.

19. A method of fabricating a semiconductor device, comprising:
forming a first fin mask pattern and a second fin mask pattern spaced apart from each other on a substrate;
forming a first fin-shaped pattern and a second fin-shaped pattern by etching the substrate using the first fin mask pattern and the second fin mask pattern as a first etch mask,
wherein the first fin mask pattern is disposed on the first fin-shaped pattern and the second fin mask pattern is disposed on the second fin-shaped pattern;
forming a field insulating layer between the first and second fin-shaped patterns and between the first and second fin mask patterns;
forming a mask layer on the second fin mask pattern to expose the first fin mask pattern;

forming a recess by removing the first fin mask pattern;

forming a trench by expanding a width of the recess, wherein the width of the recess is expanded by removing a first portion of the field insulating layer;

forming a fin-cut mask pattern filling the trench;

removing a second portion of the field insulating layer, the second fin mask pattern and the second fin-shaped pattern using the fin-cut mask pattern as a second etch mask;

removing the fin-cut mask pattern to expose the first fin-shaped pattern;

forming an insulating layer covering the first fin-shaped pattern and the field insulating layer; and removing a third portion of the field insulating layer and a portion of the insulating layer, wherein the first fin-shaped pattern protrudes above the field insulating layer and the insulating layer upon removing the third portion of the field insulating layer and the portion of the insulating layer.

20. A method of fabricating a semiconductor device, comprising:

forming a real fin-shaped pattern and a dummy fin-shaped pattern on a substrate by forming a first trench between the real fin-shaped pattern and the dummy fin-shaped pattern, wherein the first trench is formed by removing a portion of the substrate;

forming a first fin mask pattern on the real fin-shaped pattern and a second fin mask pattern on the dummy fin-shaped pattern;

forming a first field insulating layer filling the first trench;

forming a mask layer on the second fin mask pattern, wherein the mask layer is not formed on the first fin mask pattern;

forming a second trench in the first field insulating layer, wherein the second trench exposes a portion of an upper sidewall of the first field insulating layer and a top surface of the real fin-shaped pattern;

forming a third trench by expanding a width of the second trench using the mask layer as a first etch mask, wherein a bottom surface of the third trench is substantially coplanar with a top surface of the dummy fin-shaped pattern;

removing the mask layer after forming the third trench;

forming a fin-cut mask pattern filling the third trench; and removing the second fin mask pattern and the dummy fin-shaped pattern using the fin-cut mask pattern as a second etch mask.

* * * * *